(12) United States Patent
Bruce et al.

(10) Patent No.: US 8,093,103 B2
(45) Date of Patent: Jan. 10, 2012

(54) MULTIPLE CHIP MODULE AND PACKAGE STACKING METHOD FOR STORAGE DEVICES

(75) Inventors: Rey H. Bruce, San Jose, CA (US); Ricardo H. Bruce, Union City, CA (US); Patrick Digamon Bugayong, Mandaluyong City (PH); Joel Alonzo Baylon, Cavite (PH)

(73) Assignee: BiTMICRO Networks, Inc., Fremont, CA (US)

( * ) Notice: Subject to any disclaimer, the term of this patent is extended or adjusted under 35 U.S.C. 154(b) by 0 days.

(21) Appl. No.: 12/907,023

(22) Filed: Oct. 18, 2010

(65) Prior Publication Data

US 2011/0038127 A1 Feb. 17, 2011

Related U.S. Application Data

(62) Division of application No. 11/322,442, filed on Dec. 29, 2005, now Pat. No. 7,826,243.

(51) Int. Cl.
| | |
|---|---|
| *G01R 31/26* | (2006.01) |
| *H01L 21/66* | (2006.01) |
| *H01L 21/50* | (2006.01) |
| *H01L 21/48* | (2006.01) |
| *H01L 21/44* | (2006.01) |

(52) U.S. Cl. ............ 438/109; 438/14; 438/16; 438/17; 438/18; 438/800; 257/E21.613; 257/E21.661; 257/E21.662; 257/E21.526

(58) Field of Classification Search .......... 257/E21.613, 257/E21.661, E21.662, E21.526
See application file for complete search history.

(56) References Cited

U.S. PATENT DOCUMENTS

| | | | |
|---|---|---|---|
| 5,854,507 A | 12/1998 | Miremadi et al. | |
| 5,995,379 A | 11/1999 | Kyougoku et al. | |
| 6,172,874 B1 | 1/2001 | Bartilson | |
| 6,381,141 B2 | 4/2002 | Corisis et al. | |
| 6,392,896 B1 | 5/2002 | Stoller | |
| 6,469,375 B2 | 10/2002 | Beausoleil et al. | |
| 6,620,638 B1 * | 9/2003 | Farrar | 438/14 |
| 6,624,506 B2 | 9/2003 | Sasaki et al. | |
| 6,900,528 B2 | 5/2005 | Mess et al. | |

(Continued)

FOREIGN PATENT DOCUMENTS

WO  9406210 A1  3/1994

OTHER PUBLICATIONS

Jeffrey C. Demmin, Novel 3-D Packaging Approaches Simplifying the Assembly and Test Supply Chain, Business Briefing: Global Semiconductor Manufacturing Technology, 2003, pp. 1-5.

(Continued)

*Primary Examiner* — Mohsen Ahmadi
(74) *Attorney, Agent, or Firm* — Uriarte Law

(57) ABSTRACT

Stacking techniques are illustrated in example embodiments of the present invention wherein semiconductor dies are mounted in a module to become a MCM which serves as the basic building block. A combination of these modules and dies in a substrate creates a package with specific function or a range of memory capacity. Several example system configurations are provided using BGA and PGA to illustrate the stacking technique. Several pin assignment and signal routing techniques are illustrated wherein internal and external signals are routed from main board to various stacked modules. Expansion can be done both on the vertical and horizontal orientations.

16 Claims, 28 Drawing Sheets

U.S. PATENT DOCUMENTS

| | | | |
|---|---|---|---|
| 6,991,947 B1 | 1/2006 | Gheewala | |
| 7,037,757 B2 * | 5/2006 | Fox et al. | 438/109 |
| 7,098,541 B2 | 8/2006 | Adelmann | |
| 7,212,422 B2 | 5/2007 | Koide | |
| 7,285,443 B2 * | 10/2007 | Fox et al. | 438/108 |
| 7,352,602 B2 | 4/2008 | Janzen | |

OTHER PUBLICATIONS

Moody Dreiza, Akito Yoshida, Jonathan Micksch and Lee Smith, Stacked Package-on-Package Design Guideliness, Chip Scale Review, Jul. 2005, pp. 1-4, Reprinted by Amkor Technology, Inc. Chandler, Arizona.

ISA/US (Blaine Copenheaver), International Search Report and Written Opinion for International Application No. PCT/US06/62747, nine pages.

USPTO, Notice of Allowability (Detailed Action) for U.S. Appl. No. 11/322,442, filed Jul. 9, 2009, pp. 1-5, Virginia, U.S. (See p. 4).

USPTO, Notice of References Cited for U.S. Appl. No. 11/322,442, filed Jul. 9, 2009, 1 sheet, Virginia, U.S.

* cited by examiner

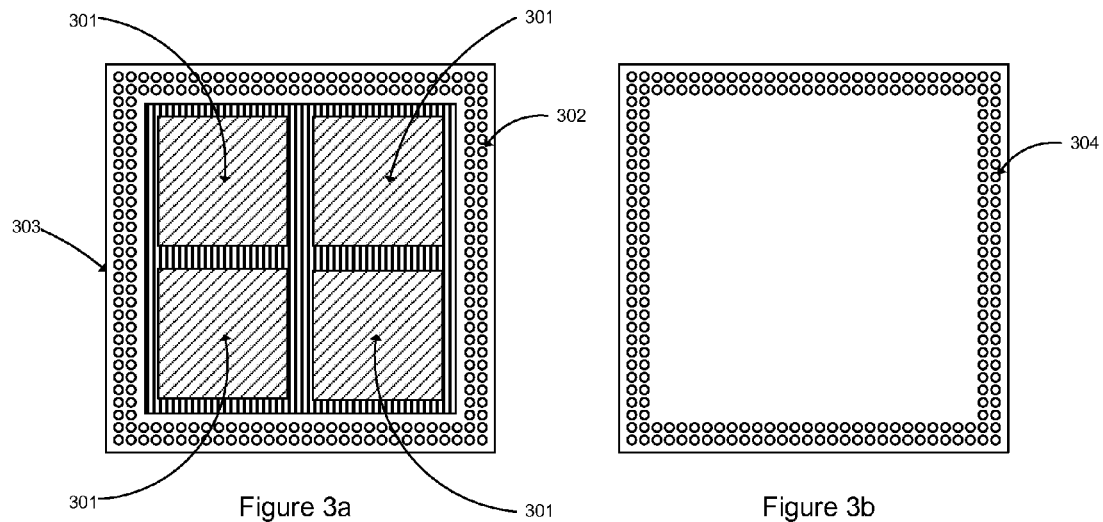
Figure 3a
Figure 3b
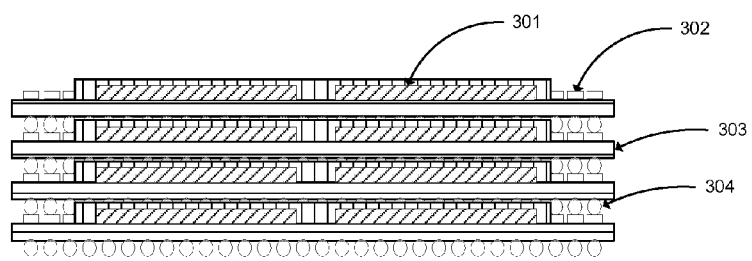
Figure 3c

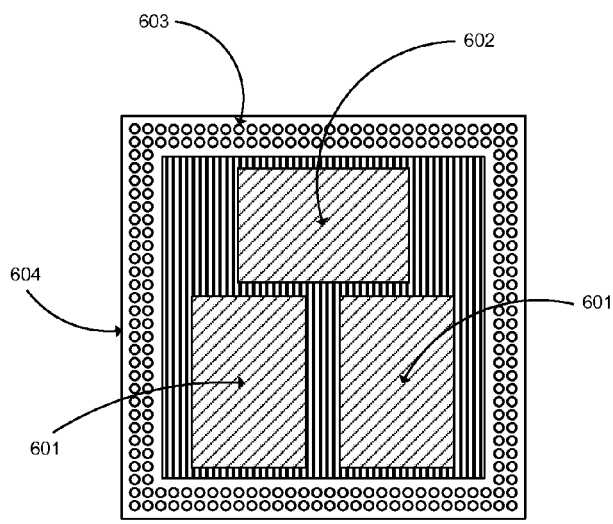 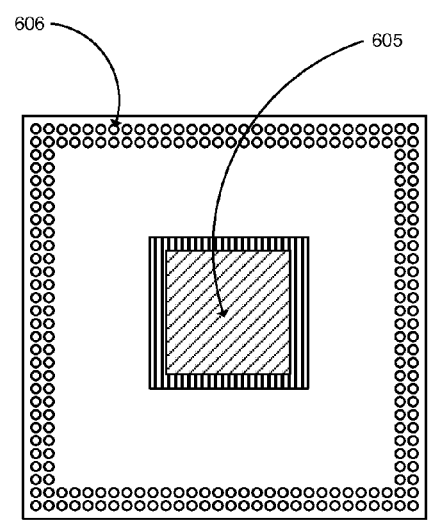
Figure 6a                     Figure 6b

MULTIPLE CHIP MODULE AND PACKAGE STACKING METHOD FOR STORAGE DEVICES

CROSS-REFERENCE(S) TO RELATED APPLICATIONS

This application claims the benefit of United States Non-Provisional Application, entitled "Multiple Chip Module and Package Stacking For Storage Devices", and having a filing date of 29 Dec. 2005 and Ser. No. 11/322,442, which is hereby incorporated by reference as if fully set forth herein.

BACKGROUND (1) Technical Field

The present invention relates to computer systems. More particularly, the present invention relates to flash memory based semiconductor disk drive and a method of using multiple chip module (MCM) and Package Stacking technique to support miniaturization and memory scalability.

(2) Description of the Related Art

A flash memory based semiconductor disk drive typically use separate packages for the interface controller, the DMA controller, the processor and separate packages for the Flash devices, the FPROMs and the RAMs. This current method limits the miniaturization of the entire storage device. In order to achieve the move to miniaturization, chip modules and packages need to be stacked. Stacking both on chip module and package level maximizes the capacity in a limited area thus realizing the move to miniaturize the entire storage device. A technique in stacking chip modules and packages strategically to support miniaturization and memory scalability in both vertical and horizontal orientation is therefore proposed.

SUMMARY

In the stacking technique illustrated in example embodiments of the present invention, semiconductor dies are mounted in a module to become a MCM which serves as the basic building block. Combination of these modules and dies in a substrate creates a package with specific function or a range of memory capacity. These packages are stacked to increase capacity or add functions. A combination of different existing technology such as flip chip, wire bond, MCM, module stacking, advance packaging, etc. are used to accomplish highly reliable module to module and package to package interconnection and scalability. A single package can have a wide range of capacity depending on the memory capacity of the die used and the number of modules stacked within the package. In the proposed package stacking technique, the stacked modules in a package serve as the building blocks for the package level stacking. Multiple packages are stacked to create the desired memory capacity and different packages are stacked to create desired function. Expansion can be done both on the vertical and horizontal orientations. The technique is in the assignment of pins. Small capacity miniature storage devices can use the vertical expansion, while high capacity devices with larger form factors can use both vertical and horizontal expansion to maximize capacity. By using this technique, large capacity storage devices are implemented in a small package device, and larger form factors achieve bigger memory capacities.

The present invention takes advantage of the existing stacking technology both on the module and package level. This maximizes the capacity in a small area, realizing the miniaturization transition. Modular approach is used in creating basic building blocks which can be tested individually and replaced easily prior to final packaging, making the technique reliable, and cost effective. A wide range of capacity can be configured through variation of die capacities and stacking modules and/or packages. Expanding capacity may be implemented vertically, horizontally or both, depending on board area and desired capacity.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the present invention may admit to other equally effective embodiments.

FIG. 3a, 3b, 3c depict the flash module's top and bottom drawings and a cross sectional representation of stacked multiple flash modules according to an example embodiment of the present invention.

FIG. 6a, 6b depict the first low-end controller module's top and bottom drawings according to an example embodiment of the present invention.

DETAILED DESCRIPTION OF THE INVENTION

Figure 1A:
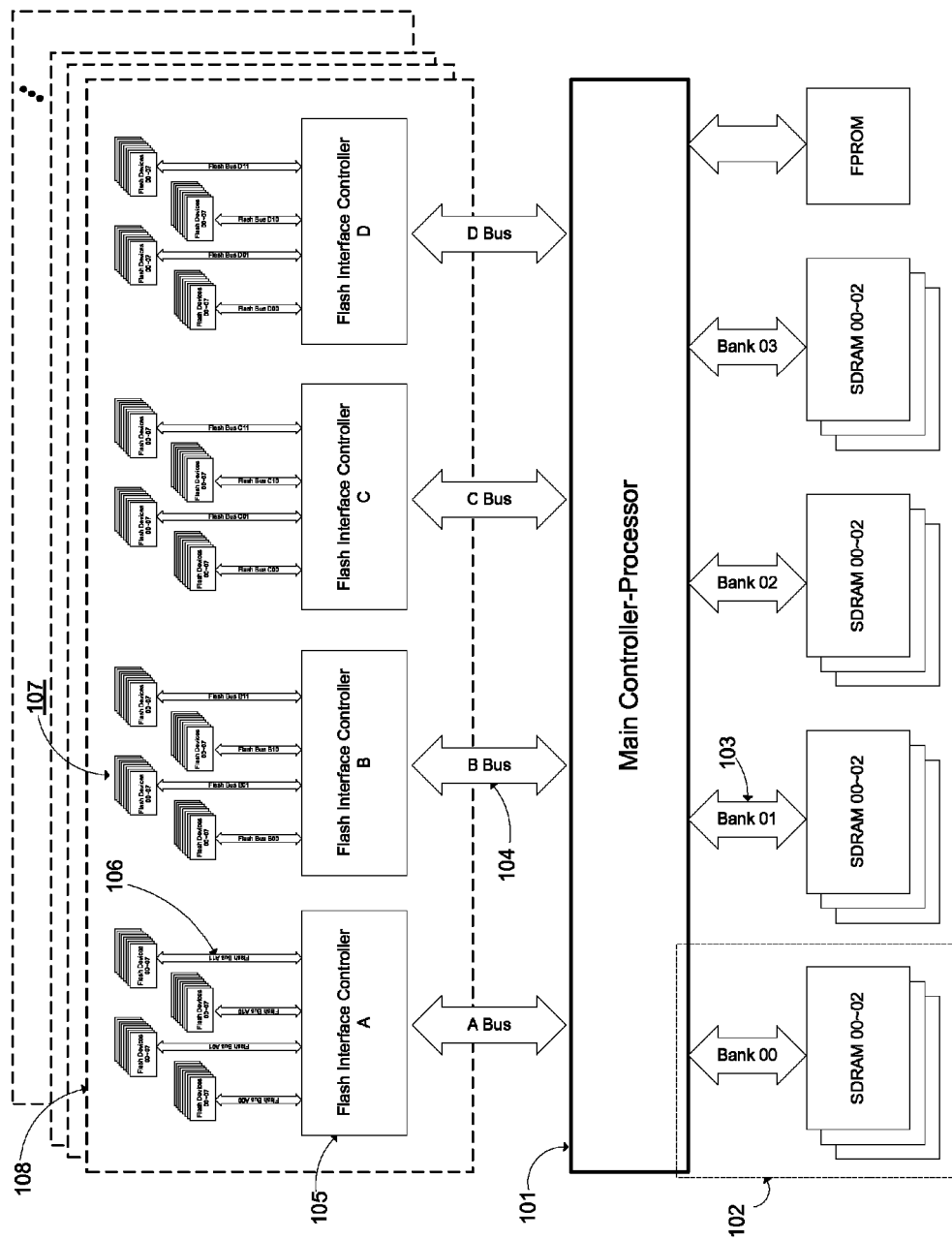
FIG. 1a shows the block diagram of the stackable system for high performance, high capacity devices according to an example embodiment of the present invention.

FIG. 1a is a block diagram of a flash storage system according to a first example embodiment of the present invention. The block diagram shows the entire high-end system that is modularized, stacked, and packaged to achieve the desired features of the technique. The heart of the system is the main controller-processor 101 which interfaces with the flash memory, the flash PROM and the SDRAM memory blocks. The SDRAM is configured from a single bank 102 to a maximum of four banks depending on the desired capacity. Each bank such as 102 includes 3 SDRAMs. The flash devices such as 107 are controlled by the Flash Interface Controller such as 105. Each controller supports four flash buses such as flash bus A11 106, and each flash bus supports a maximum of 8 flash devices. The main controller-processor supports four flash interface controllers through 4 different busses such as B bus 104. The four flash interface controllers with their corresponding flash devices comprise the memory set 108. The main controller-processor can support from one memory set to a maximum of 15 memory sets. This is a maximum support of 1,920 flash devices.

Figure 1B:
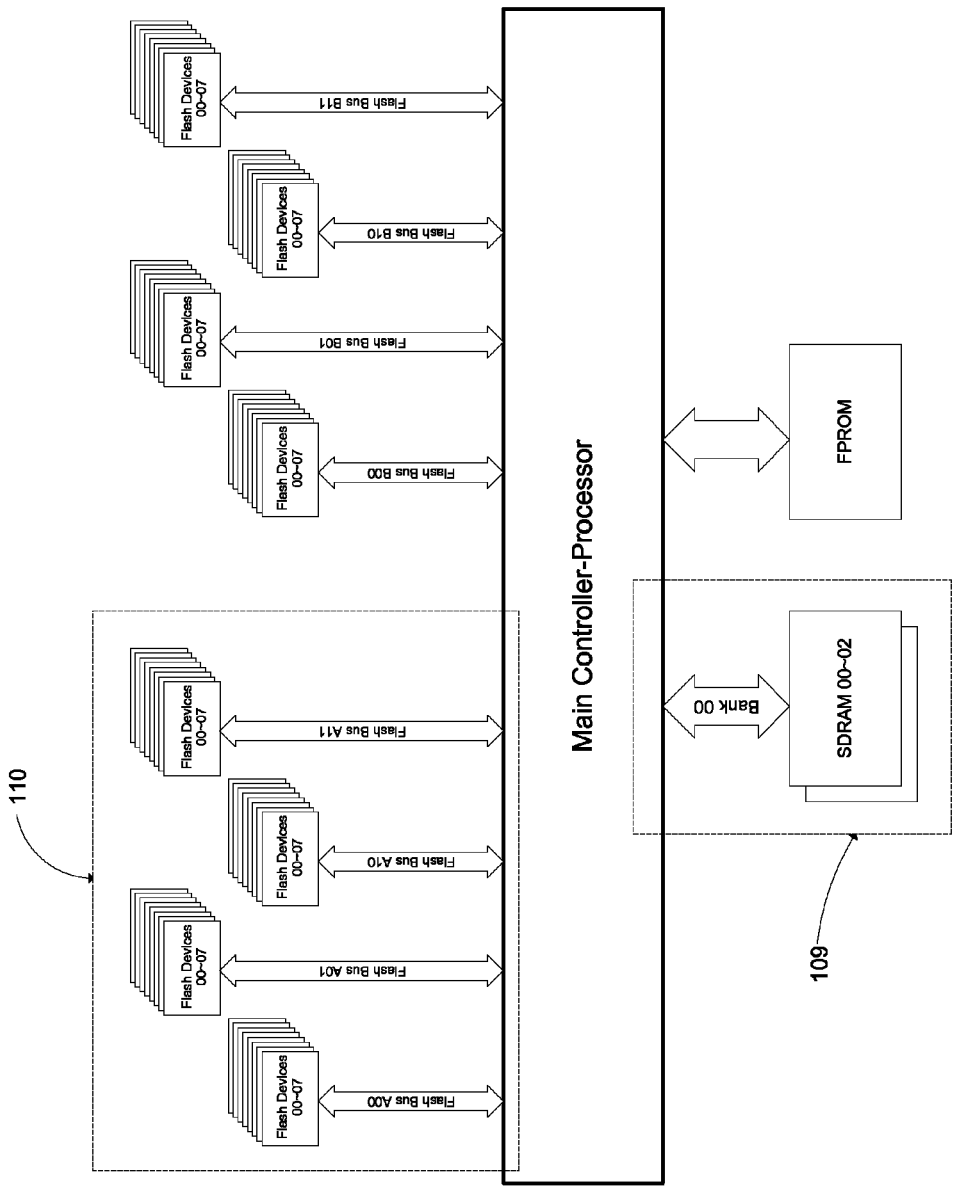
FIG. 1b shows the block diagram of the stackable system for lower performance, lower capacity devices according to an example embodiment of the present invention.

FIG. 1b is a block diagram of a flash storage system according to a second example embodiment of the present invention. The block diagram shows the entire low-end system that is modularized, stacked, and packaged to achieve the desired features of the technique. Since a low-end system may not require a large amount of memory capacity, SDRAM may be limited to one bank 109, or none at all, and the supported flash devices may also be limited to only two sets of flash buses. One set of flash buses 110 consists of four flash bus with 8 flash devices supported per flash bus, which results in a maximum supported number of 64 flash devices.

Figure 2A:
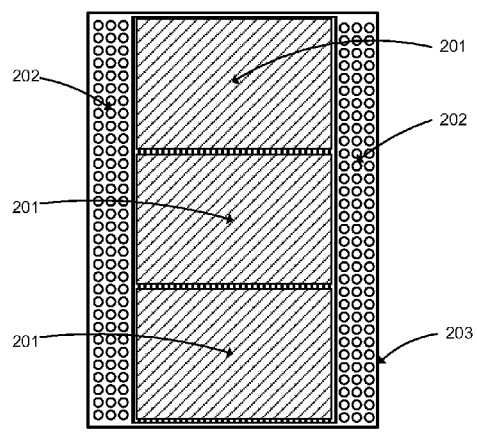
FIG. 2a, 2b, 2c depict the SDRAM module's top and bottom drawings and a cross sectional representation of stacked multiple SDRAM modules according to an example embodiment of the present invention.
Figure 2B:
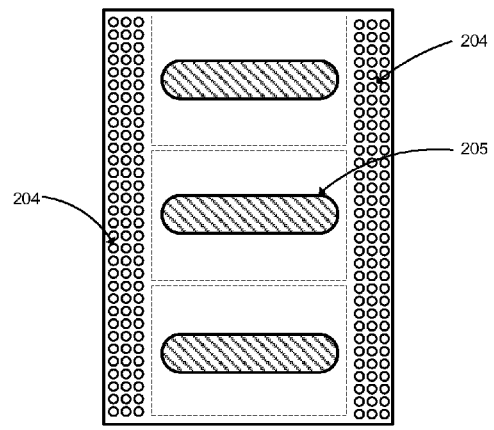
Figure 2C:
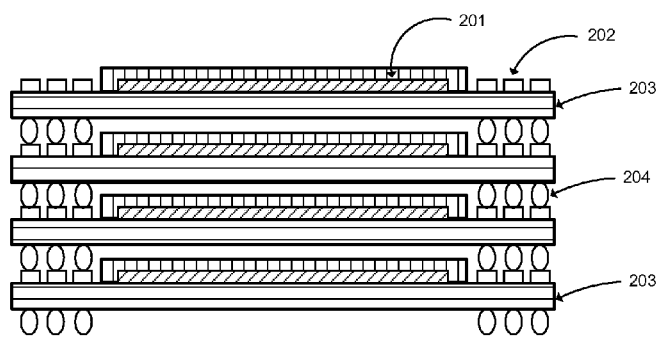

From the basic dies; SDRAM, FPROM, flash memory, flash interface controller, and the main controller-processor, single and multiple chip modules are created to become the basic building blocks for the stacking technique presented in the present invention. Referring to FIG. 2a which is a top view of an SDRAM module, three SDRAM dies 201 are placed in a single substrate 203 to become the SDRAM module which is one of the basic building blocks. The SDRAM module is represented in FIG. 1 as a single bank 102 composed of SDRAM 00, SDRAM 01, and SDRAM 02 connected to the SDRAM interface 103. All signals needed to interface to the controller module and other SDRAM modules are assigned in both the bottom balls 204 and top pads 202 respectively. Bottom balls 204 are shown in FIG. 2b which is a bottom view of the SDRAM module. Three slots 205 are created under the SDRAM die's pad attach area to accommodate bottom wire bonding. FIG. 2c is the stacked module cross sectional representation. Top pads 202 and bottom balls 204 act as the vertical interconnects between all SDRAM modules and to the controller module. Varying the SDRAM die capacity and the stack quantity, provides for a wide range of total SDRAM capacity depending on the product application. The SDRAM device organization, capacity and bank limitations are defined by the main controller-processor's SDRAM interface specifications. The main controller-processor intended to be used for this example embodiment of the present invention supports a 32-bit wide 4 banks maximum SDRAM configuration.

FIG. 3a is a top view that shows four flash dies 301 in a single substrate 303 that collectively form part of a flash module, which can also function as a basic building block. All signals needed to interface with the memory module and other flash modules are assigned in both the bottom balls 304 and the top pads 302 respectively. In FIG. 3c, the flash modules are stacked. Maximum stack quantity depends on the flash interface controller specifications. Top pads 302 and bottom balls 304 acts as the vertical interconnects between stacked flash modules and to the memory module. Varying the flash die capacity and the stacking quantity results in a wide range of total flash capacity depending on the product application and capacity requirements. The flash device organization and capacity limitations are defined by the flash interface controller's specifications. The flash interface controller intended to be used for this used for this example embodiment of the present invention supports 8 flash devices per flash bus, thus allowing a maximum stacking of 8 flash modules.

Figure 4A:
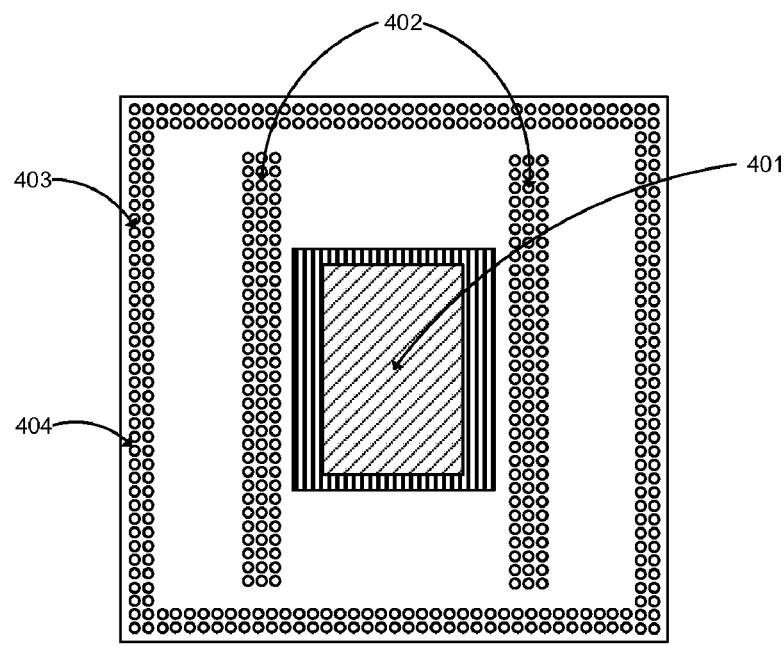
FIG. 4a, 4b depict the first high-end controller module's top and bottom drawings according to an example embodiment of the present invention.
Figure 4B:
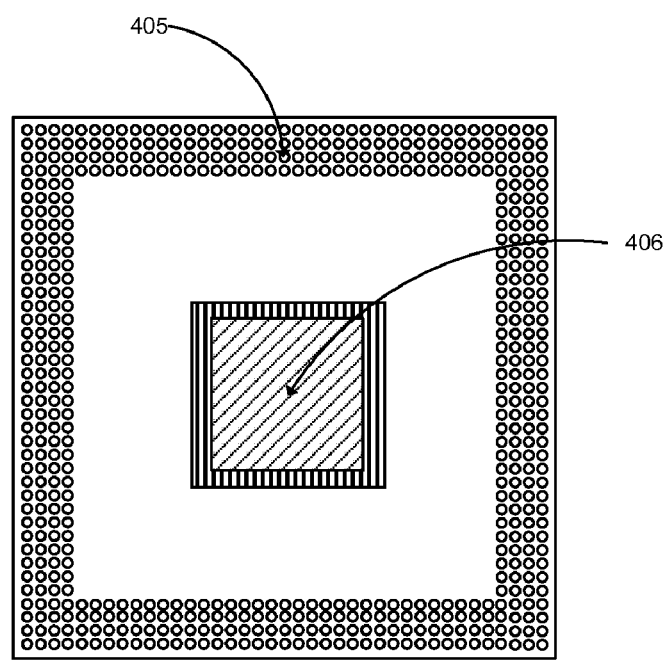

FIG. 4a shows the top view of the first example embodiment of the present invention illustrated in a first high-end controller module configuration. A single FPROM die 401 is placed at the center of the substrate 404. Pads are composed of two sections, one for the SDRAM module interface shown as 402 and another for the memory module interface shown as 403. This technique enables multiple stacking of both SDRAM modules and memory modules in a single package. FIG. 4b shows the bottom view of the controller module. A single main controller-processor die 406 is placed at the center of the substrate. The controller module becomes a base module for the package. The balls 405 are used to connect to the main substrate which is typically a printed circuit board (PCB).

Figures 5A, 5B:
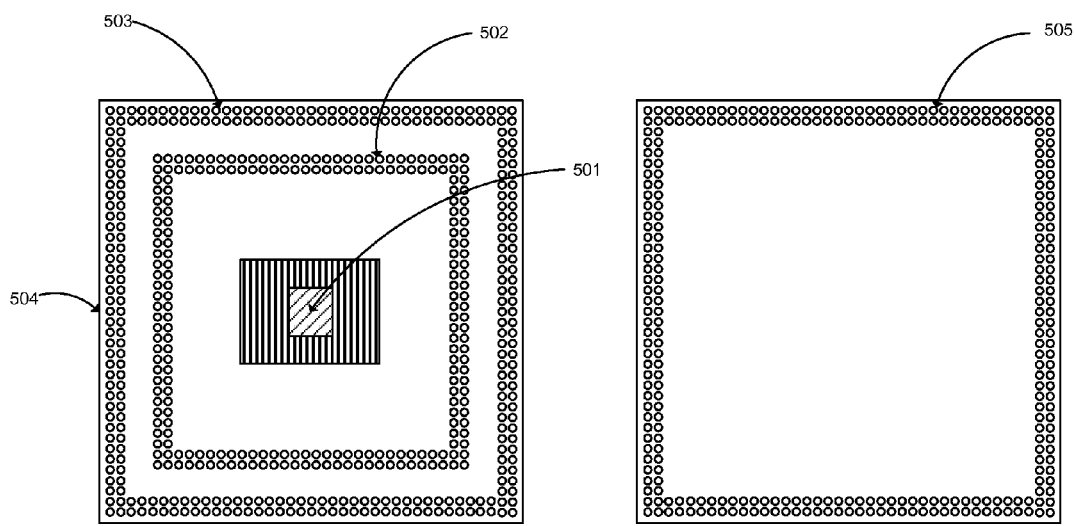
FIG. 5a, 5b depict the memory module's top and bottom drawings according to an example embodiment of the present invention.

FIG. 5a shows the top view of the memory module which is also a basic building block. A single flash interface controller die 501 is placed on the center of the substrate 504. Pads are composed of two sections, one for the flash module interface shown as 502 and another for the other memory module interface shown as 503. This technique enables multiple stacking of flash modules and memory modules in a single package. The memory module becomes a base module for the package. FIG. 5b shows the bottom view of the memory module. The memory module balls 505 are used to connect to the main substrate PCB, to the controller modules or to the other memory modules depending on the type of configuration desired.

FIG. 6a shows the top view of the second example embodiment of the present invention illustrated in a first low-end controller module configuration. Two SDRAMs 601 and a single FPROM 602 are placed on top of the module. This configuration is flexible. The SDRAMs can be unpopulated in a low performance application. Internal SRAMs in the main controller-processor will take over the SDRAM functions. The main controller-processor 605 is placed at the bottom of the module. This configuration does not allow stacking of the SDRAM which is not necessary for low capacity applications. Flash modules are stacked on top, interfacing to the pads 603. The substrate 604 is the same size as the flash module making its final package smaller. The bottom balls 606 are used to interface with the main PCB.

Figure 7A:
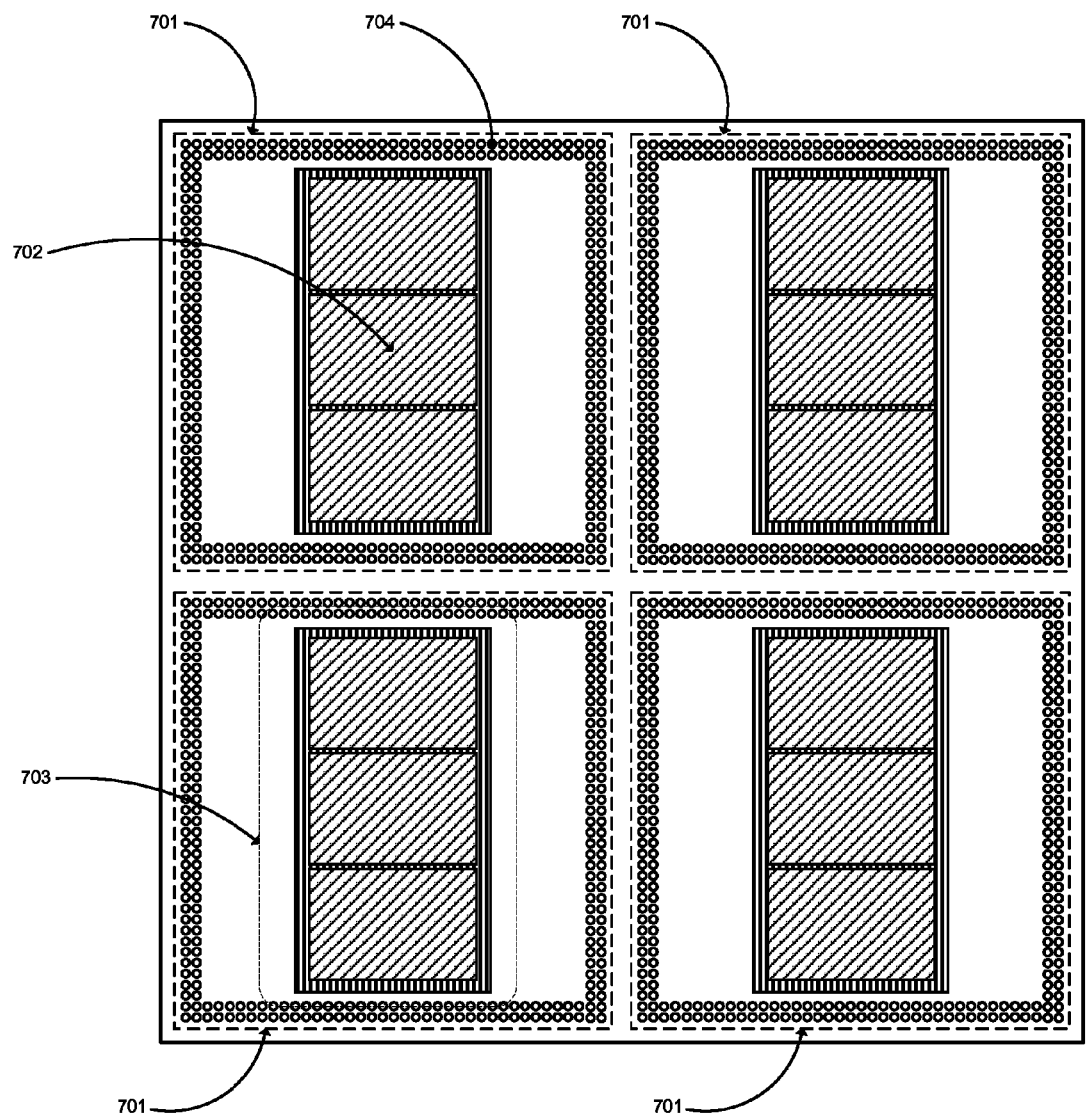
FIG. 7a, 7b depict the second high-end controller module's top and bottom drawings according to an example embodiment of the present invention.
Figure 7B:
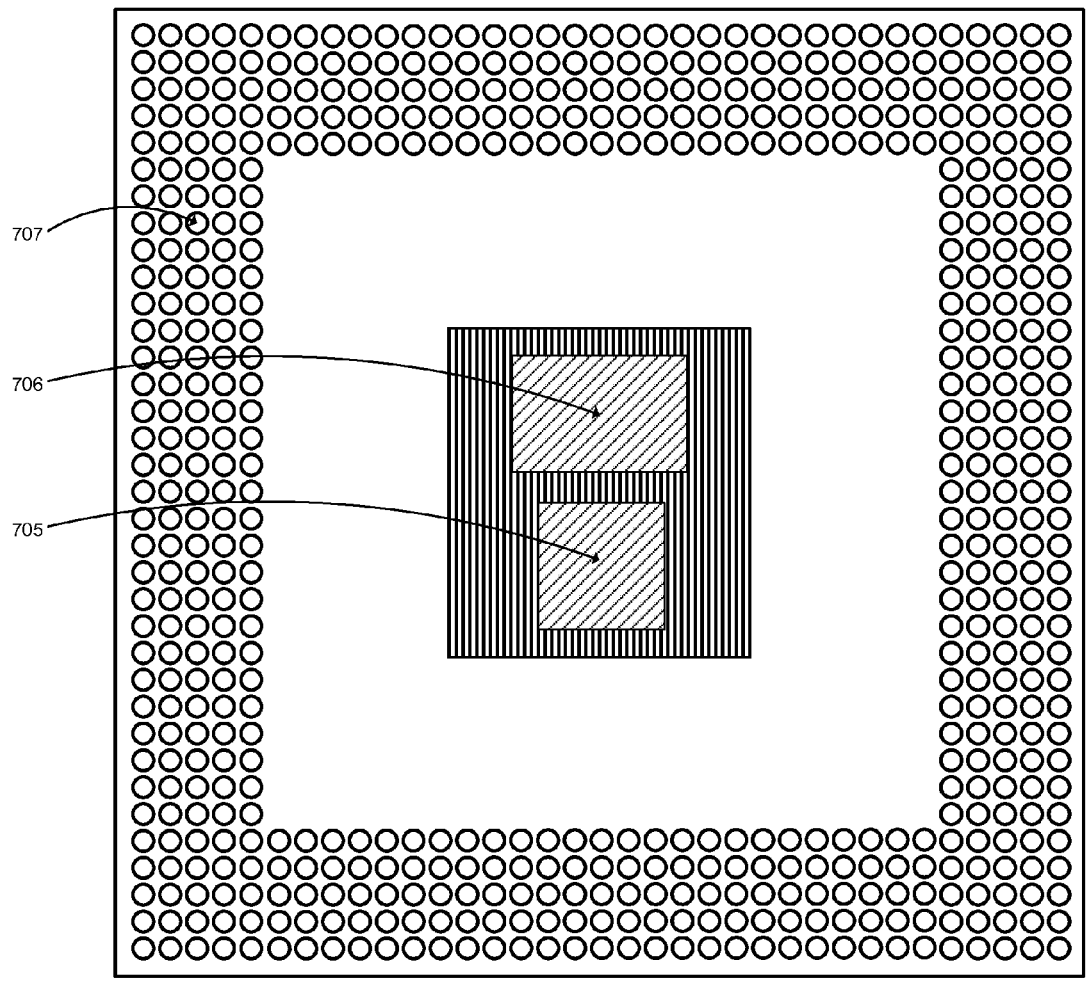

FIG. 7a shows the top view of the first example embodiment of the present invention illustrated in a second high-end controller module configuration, where four memory modules 701 can be mounted on separate locations adjacent to each other. Memory module interface pads 704 are allocated for multiple stack configurations. In the middle of the memory module interface pads, 3 SDRAM dies 702 are mounted. Each area corresponds to one SDRAM bank 703, totaling to a maximum of 4 SDRAM banks in the package. The bottom view is presented in FIG. 7b, where the main controller-processor die 705 and the FPROM die 706 are mounted adjacent to each other. The module's balls 707 are used for external interface to the main PCB.

Figure 8A:
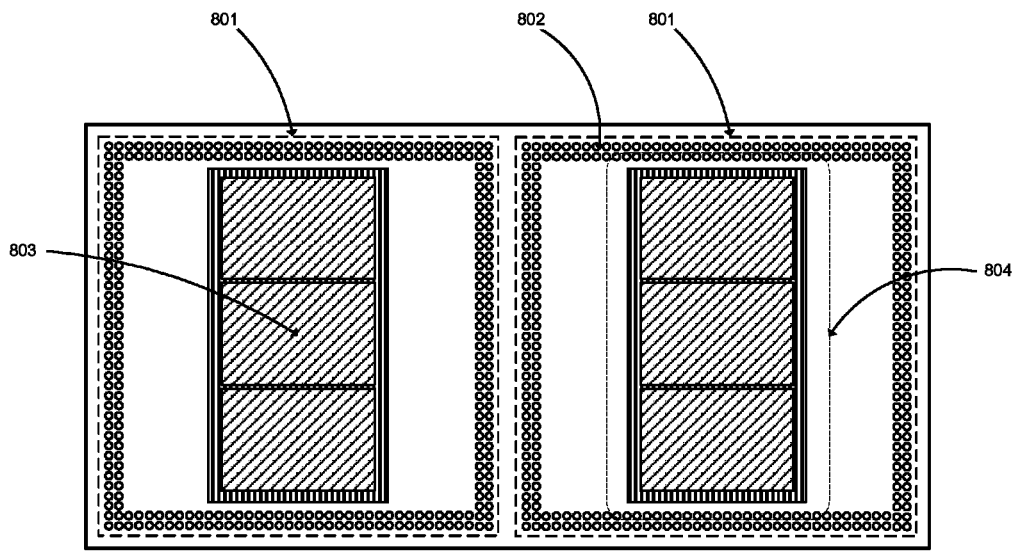
FIG. 8a, 8b depict the second low-end controller module's top and bottom drawings according to an example embodiment of the present invention.
Figure 8B:
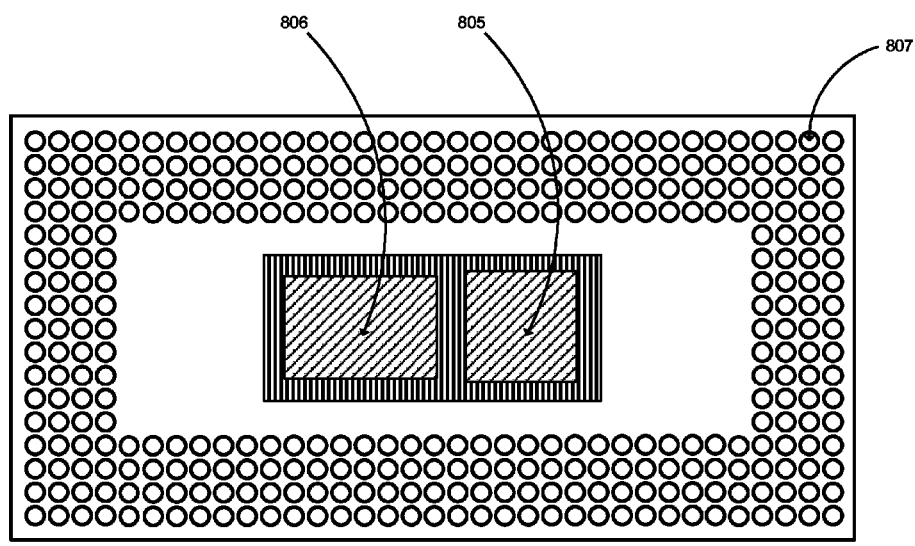

FIG. 8a shows the top view of the second example embodiment of the present invention illustrated in a second low-end controller module configuration, where only two memory modules 801 can be mounted side-by-side. Memory module interface pads 802 are allocated for multiple stacking configurations. In the middle of the memory module interface pads, 3 SDRAM dies 803 are mounted. Each area corresponds to one SDRAM bank 804, totaling to only a maximum of 2 SDRAM banks in a package. The SDRAM can either be mounted or not depending on the application. Internal SRAMs can also be used instead of the SDRAMs. The stacked memory modules can also be configured to support both internal and external flash interface controller applications. The bottom view is presented in FIG. 8b, where the main controller-processor die 805 and the FPROM die 806 are mounted adjacent to each other. The module balls 807 are used for external interface to the main PCB.

Figure 9:
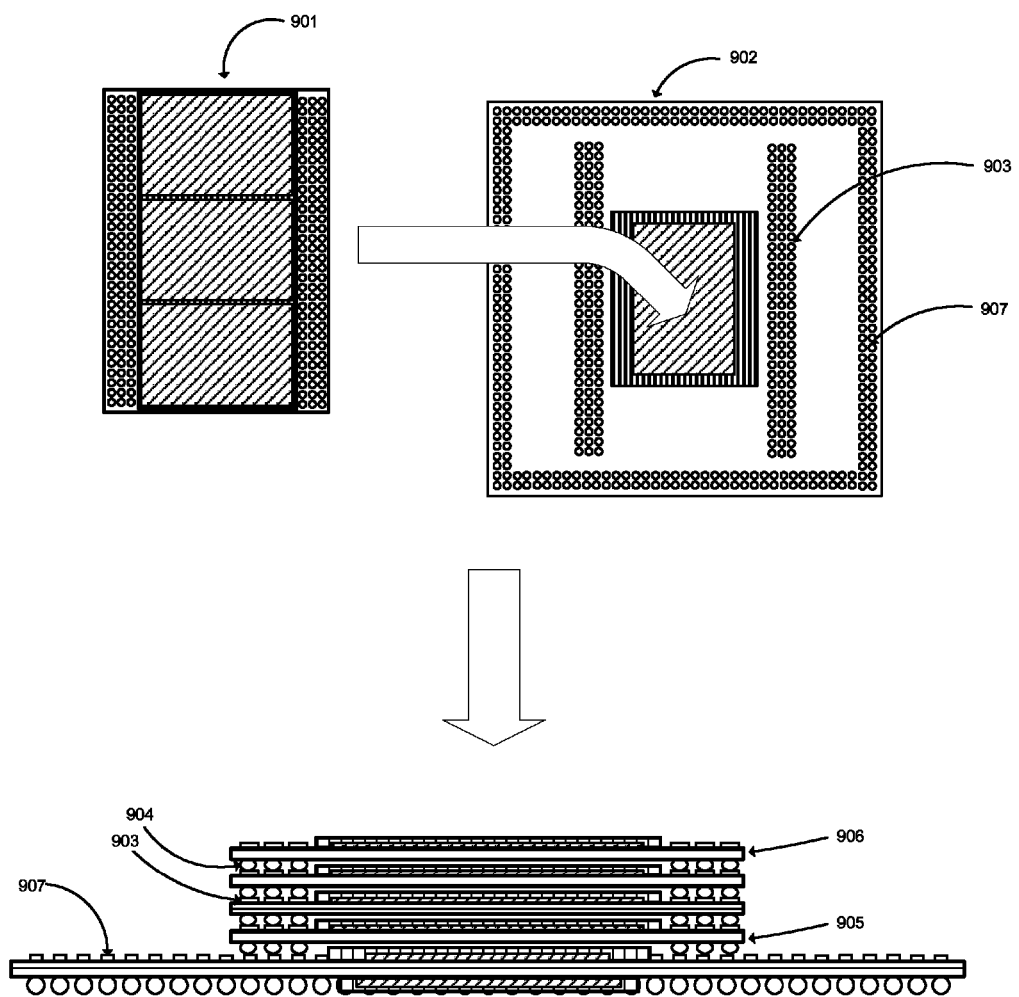
FIG. 9 depicts the stacked SDRAM modules further stacked on the controller module according to an example embodiment of the present invention. This configuration is used for high end applications. The figure also shows how the balls have corresponding pads for inter-module connection.

FIG. 9 shows the stacking of SDRAM module 901 and controller module 902. A single or stacked SDRAM module can be placed on top of a controller module. The pads for the SDRAM module interface 903 must align with the SDRAM module balls 904. The bottom-most SDRAM module 905 serves as bank 0, and the top-most module 906 serves as bank 3. For low capacity SDRAM requirements, only a single or dual bank is enough. High capacity devices needs to have a maximum SDRAM capacity, thus stacking the maximum of 4 modules. The outer pads 907 are for the memory module interface.

Figure 10:
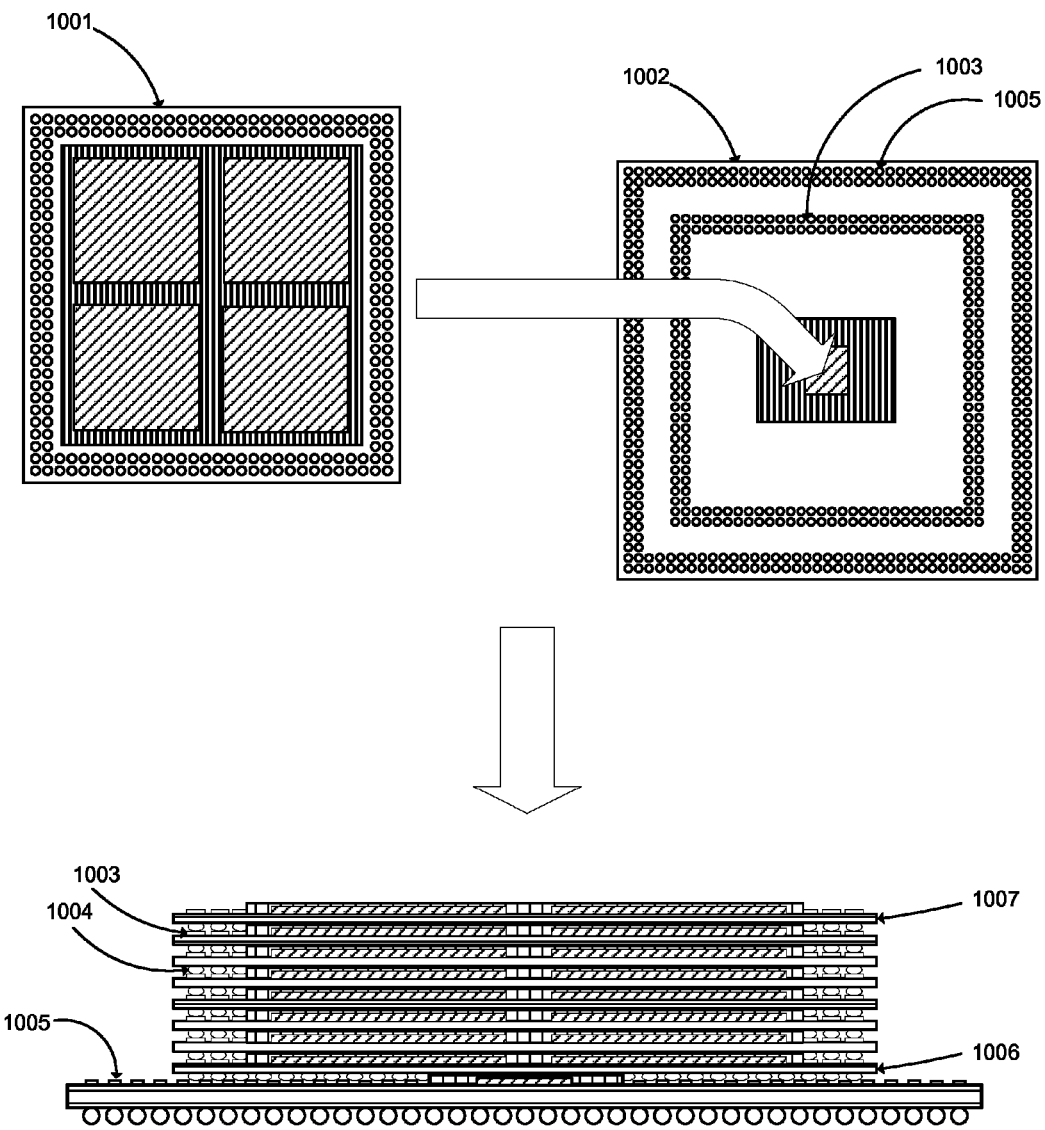
FIG. 10 depicts stacked flash modules further stacked on the memory module according to an example embodiment of the present invention. The figure also shows how the balls have corresponding pads for inter-module connection.

FIG. 10 shows the stacking of flash modules 1001 and memory module 1002. A four-stack or eight-stack flash module is placed on top of a memory module. The pads for the flash module interface 1003 must align with the flash module balls 1004. The outer pads 1005 are for other memory module interface. The flash interface controller intended to be used for this example embodiment of the present invention supports a maximum of 4 flash buses and each flash bus supports a maximum of 8 flash devices. The bottom-most flash module 1006 contains the 4 flash buses' Flash 00 devices and the top-most module 1007 contains the 4 flash buses' Flash 07 devices.

Figure 11:
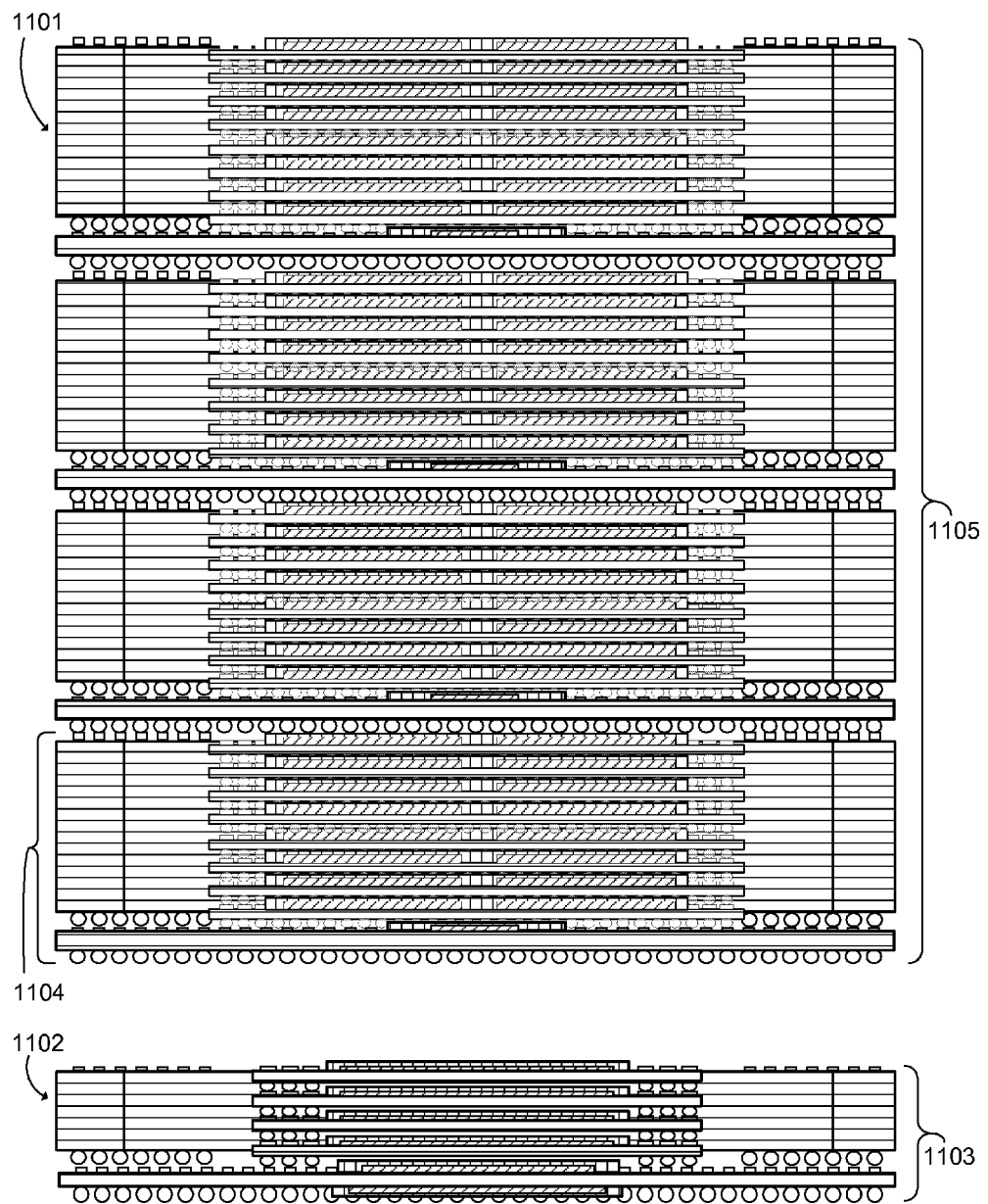
FIG. 11 depicts the possible stacking options for the first high-end controller module and the memory modules according to an example embodiment of the present invention. A substrate interface is used to attach one group of stacked modules to another.

FIG. 11 shows a sample of a maximized stacking technique that can be configured through vertical, horizontal or combined expansion. Multiple staking will increase the overall height of the module, thus requiring a filler 1101 to physically interconnect two stacked modules. A thinner filler 1102 may be used depending on the height differential between the modules which is dependent to the number of stacks applied. A controller module with the stacked SDRAM modules act as the controller package 1103. A memory module with stacked flash modules acts as the memory package 1104. Four memory packages stacked together form the memory set 1105. Vertical expansion happens when the controller package is stacked with a single or multiple memory sets. The figure shows a single memory set to be stacked to the controller package. Horizontal expansion happens when the controller package is located on a different site on the PCB relative to the memory sets. Also multiple memory sets can be located on different sites on a PCB. Combo expansion happens when both vertical and horizontal expansion technique is implemented simultaneously. The expansion technique is very flexible depending on the desired memory capacity, main PCB size limitations and also height limitations.

Figure 12A:
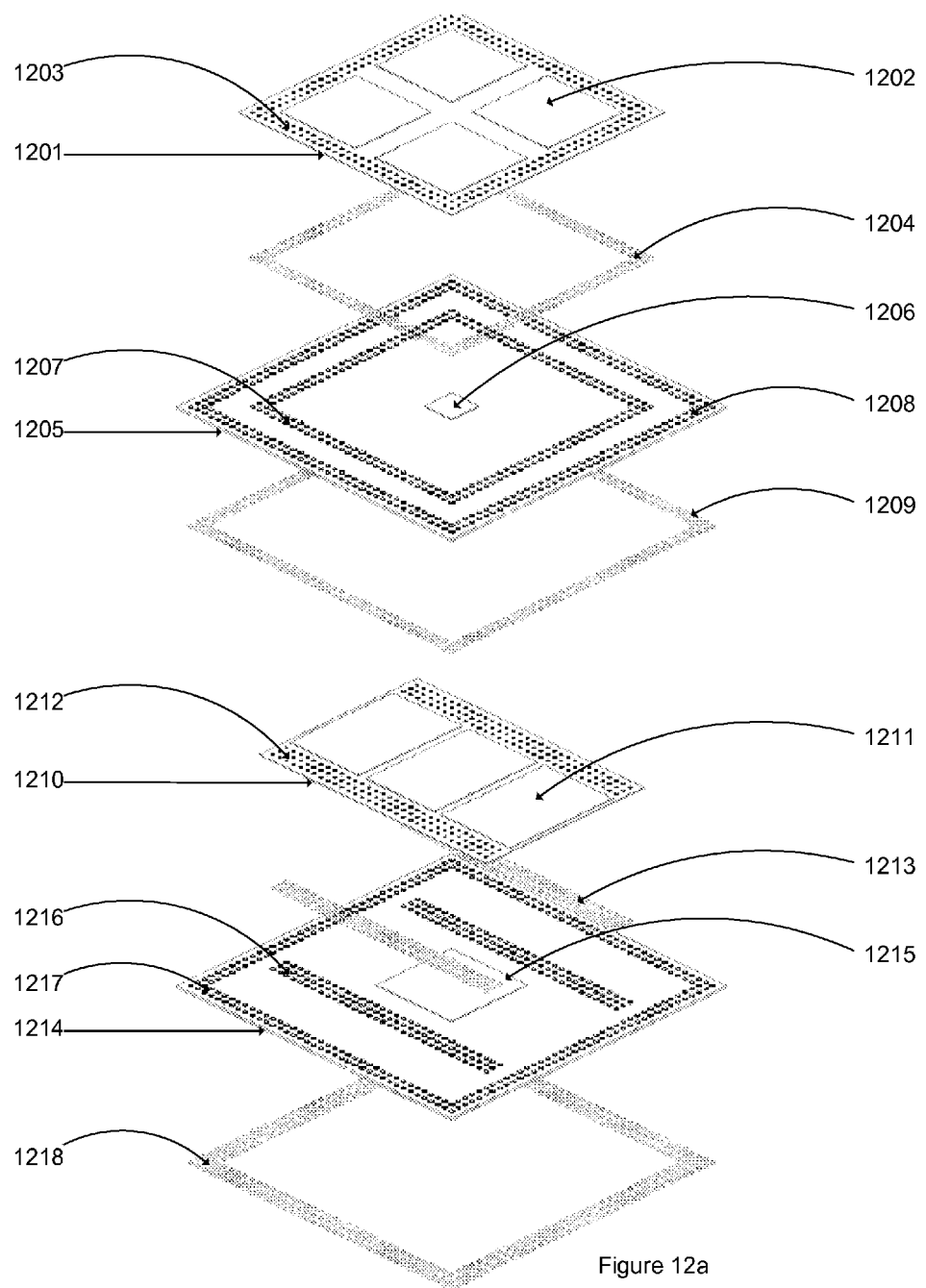
FIG. 12a is an isometric exploded drawing of the stacking technique presented in FIG. 11 according to an example embodiment of the present invention. Multiple identical stacking is not included in this drawing.

FIG. 12a shows the isometric and exploded drawing of the stacking technique for the first high-end controller configuration. Pins are assigned strategically and modules are stacked to make possible the miniaturization of the entire system in a package.

Figure 12B:
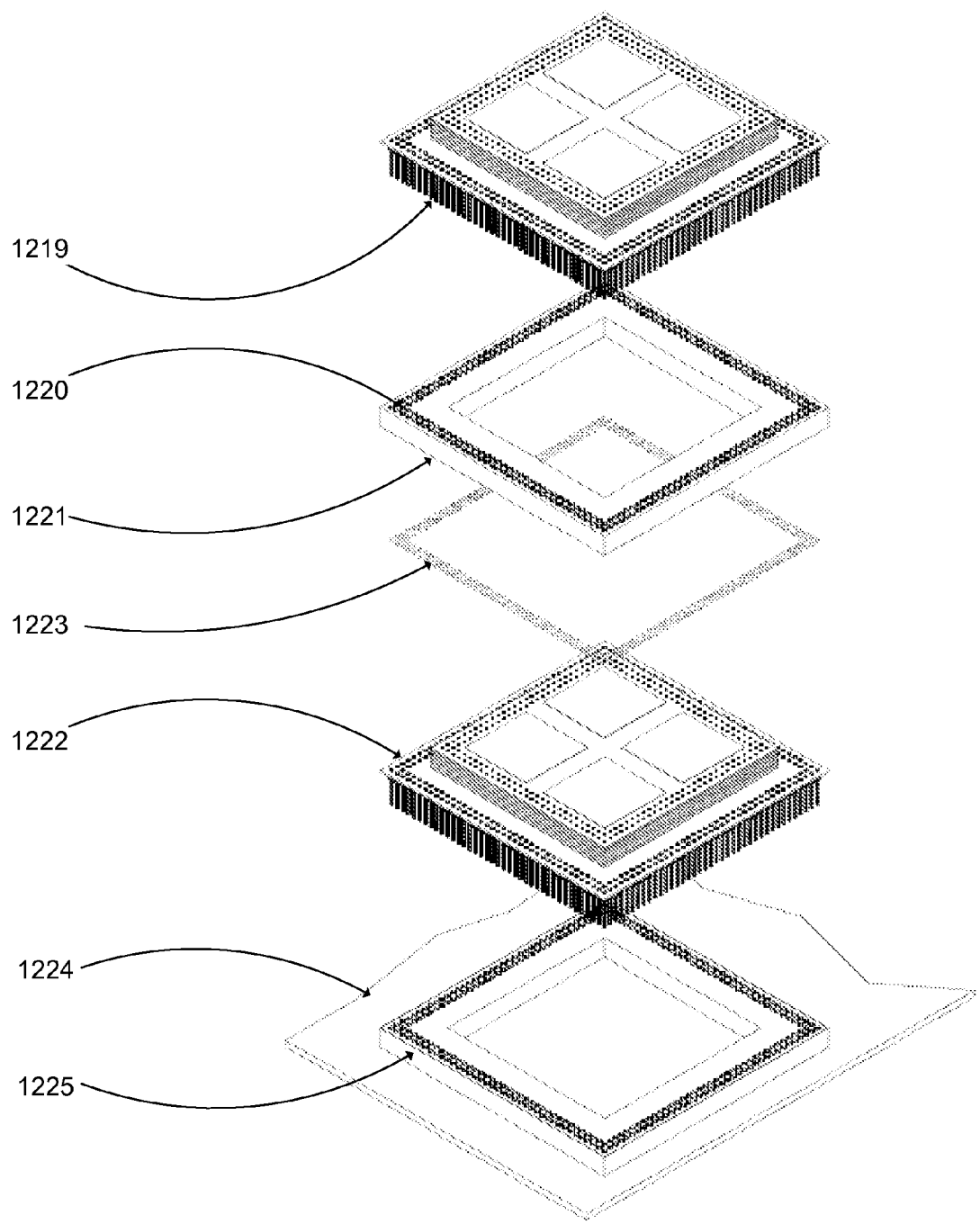
FIG. 12b is another package stacking technique using Pin Grid Array (PGA) rather than Ball Grid Array (BGA) according to an example embodiment of the present invention. This is used for easy replacement and expansion.

1201—The Flash Module
    1202—The Flash Die
    1203—The Flash Module Pad Interface to other Flash Modules
    1204—The Flash Module Solder Balls
    1205—The Memory Module
    1206—The Flash Interface Controller Die
    1207—The Memory Module Pad Interface for the Flash Module
    1208—The Memory Module Pad Interface for the other Memory Modules
    1209—The Memory Module Solder Balls
    1210—The SDRAM Module
    1211—The SDRAM Die 1212—The SDRAM Module Pad Interface to other SDRAM Modules
1213—The SDRAM Module Solder Balls
1214—The Controller Module
1215—The FPROM Die on top side and the Main Controller-Processor Die at the bottom side.
1216—The Controller Module Pad Interface to the SDRAM Modules
1217—The Controller Module Pad Interface to the Memory Modules
1218—The Controller Module Solder Balls FIG. 12b is another technique used in this invention to ease replacement and facilitate expansion. Instead of using Ball Grid Array (BGA), Pin Grid Array (PGA) 1219 is used. This method makes it more flexible due to the technology's inherent feature where replacement is done swiftly without any assembly process involved. Horizontal expansion is also benefited in this technology. The figure shows the stacked memory module as an example. The memory module is packaged using the PGA technology, where the top portion of the package becomes the socket 1220 and the bottom portion the pin arrays 1219. The filler 1221 becomes the package's top socket and is interfaced into the base module 1222 through the BGA 1223. The base module uses PGA to interface to the bottom package or to the main board 1224. Filler 1225 is also mounted into the main board to interface the stacked memory modules.

Figure 13:
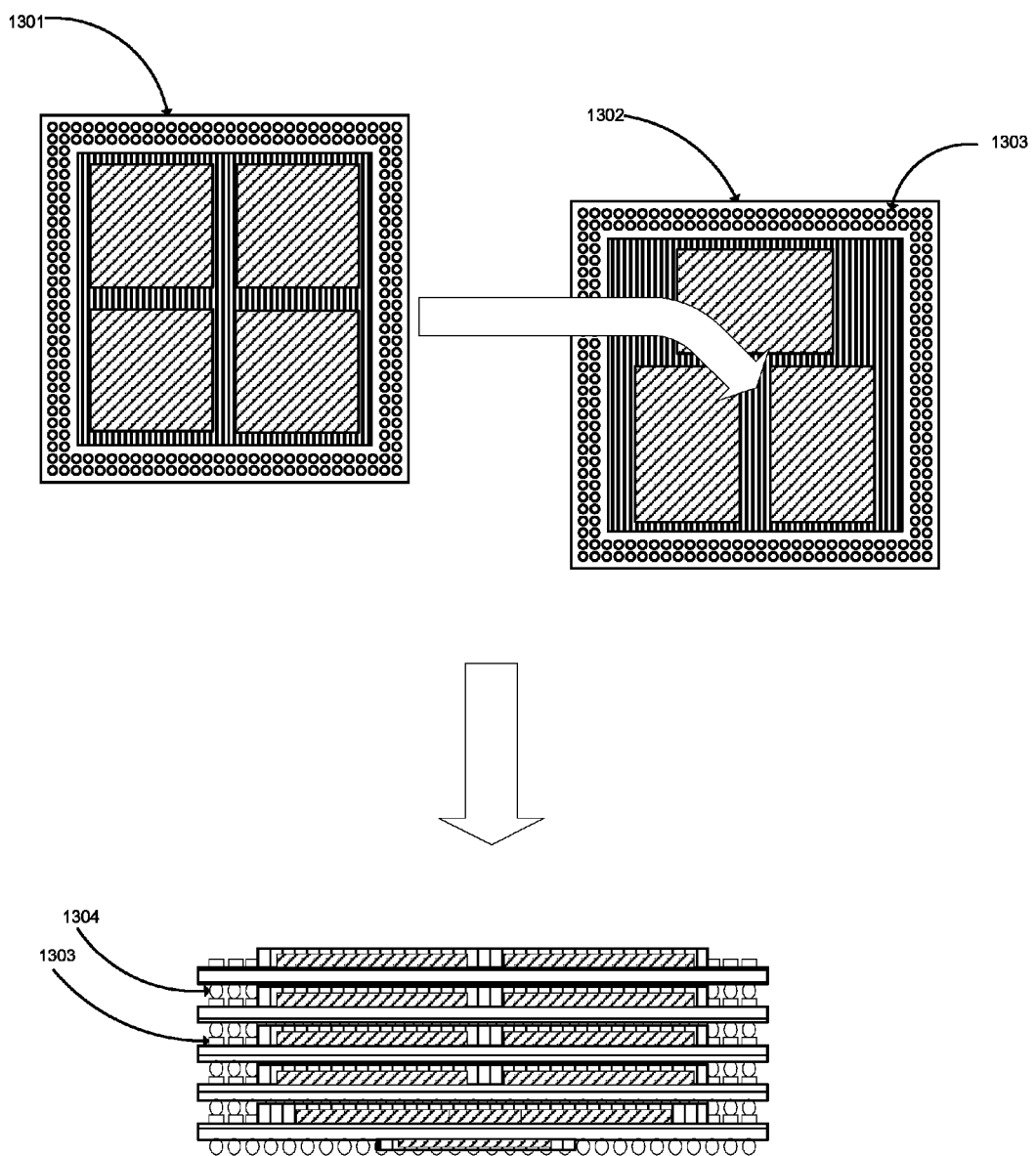
FIG. 13 depicts the low-end controller module configuration with stacked flash module according to an example embodiment of the present invention. The figure also shows how the balls have corresponding pads for inter-module connection.

FIG. 13 shows the stacking of the flash module 1301 and the first low-end type of controller module 1302. A single or stacked flash module can be placed on top of the controller module. The pads for the flash module interface 1303 must align with the flash module balls 1304. This configuration is for low capacity low performance applications. The number of flash modules to be stacked depends on the desired capacity and is limited to the supported feature of the main controller-processor. The main controller-processor's flash interface can support a maximum of 8 buses and a maximum of 8 flash devices per bus.

Figure 14:
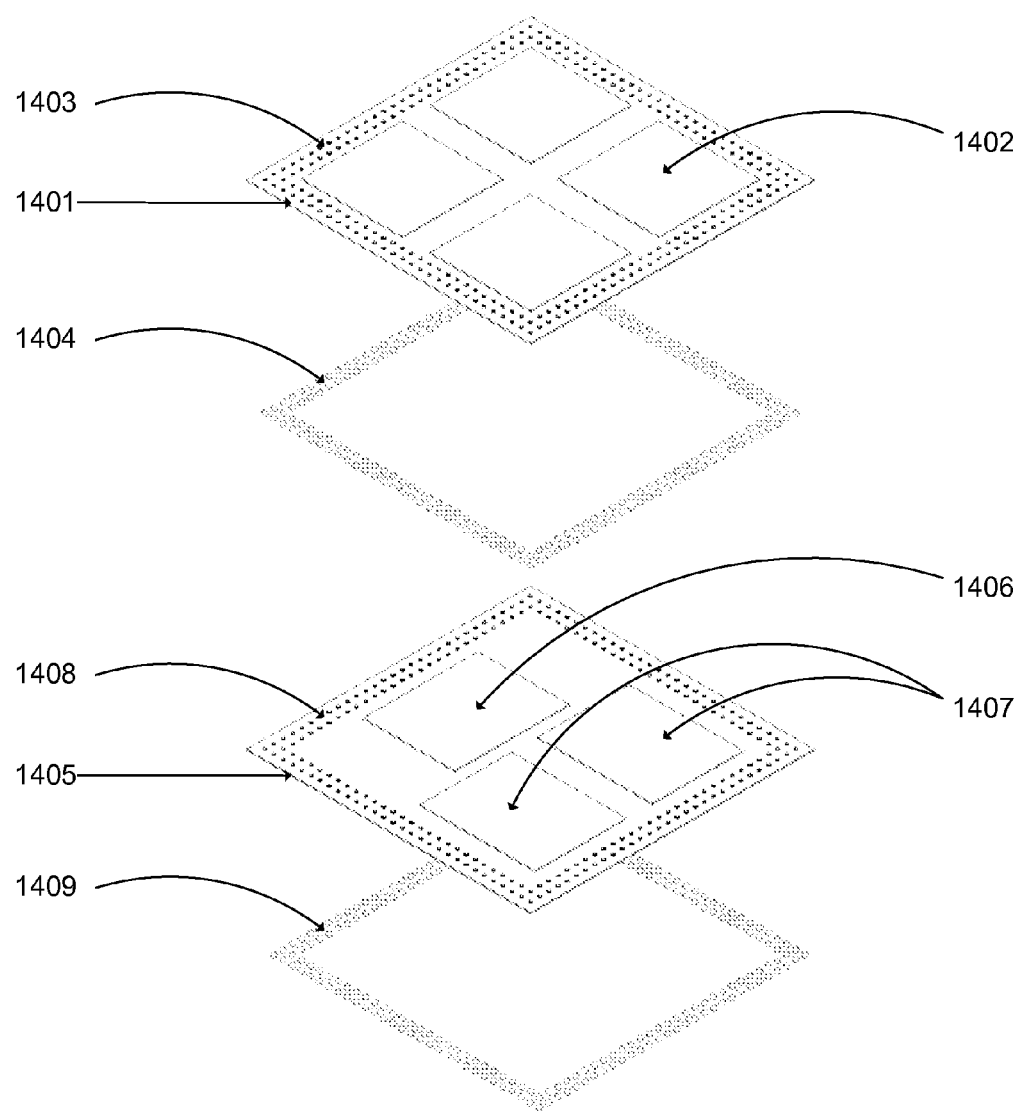
FIG. 14 is an isometric exploded version of the stacking technique presented in FIG. 11 according to an example embodiment of the present invention.
Figure 15A:
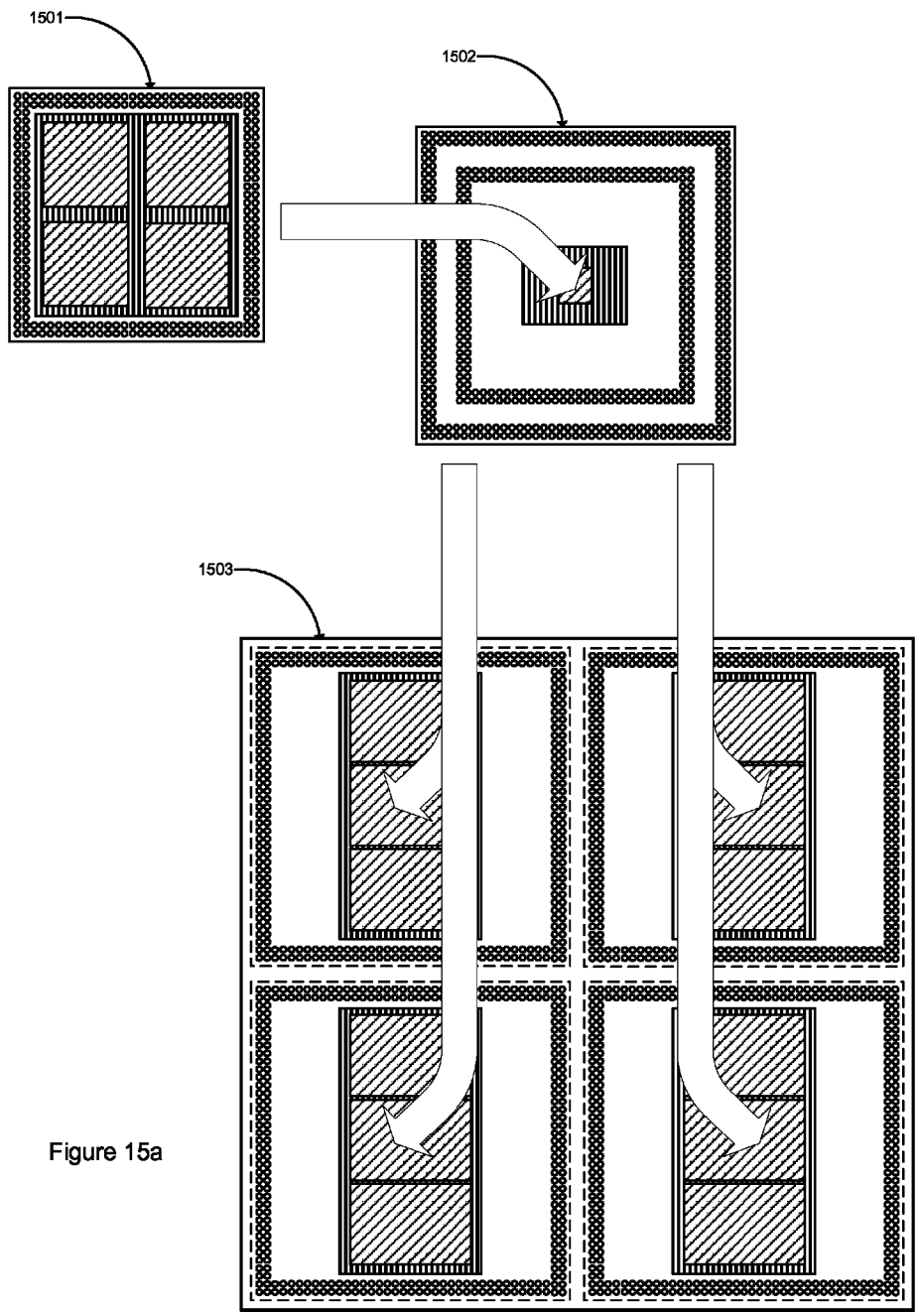
FIG. 15a, 15b depict the second high-end controller module configuration with stacked memory modules according to an example embodiment of the present invention. The figures also show how the balls have corresponding pads for inter-module connection.
Figure 15B:
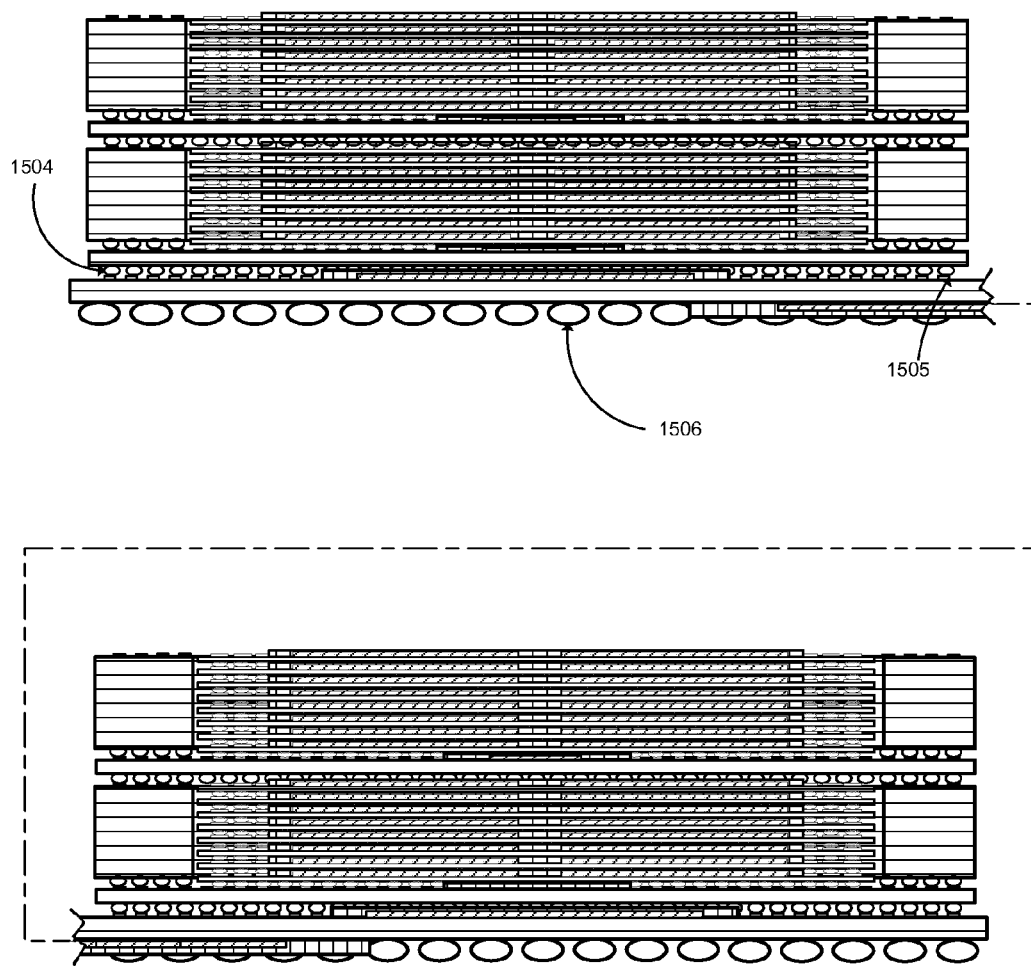

FIG. 14 shows the isometric and exploded drawing of the stacking technique for the first low-end controller configuration. Pins are assigned strategically and modules are stacked to make possible the miniaturization of the entire system in a package.
1401—The Flash Module
1402—The Flash Die
1403—The Flash Module Pad Interface to other Flash Modules
1404—The Flash Module Solder Balls
1405—The Controller Module
1406—The FPROM Die and the Main Controller-Processor Die at the bottom
1407—The SDRAM Die
1408—The Controller Module Pad Interface to the Flash Modules
1409—The Controller Module Solder Balls FIG. 15a shows the stacking technique for the second high-end controller configuration. The stacked flash modules 1501 are further stacked on top of the memory modules 1502 which are then mounted on the controller module 1503 on four different locations. Four memory modules can be mounted on four different locations on the controller module creating a memory set. Stacking more memory sets increases the total capacity. The cross-sectional representation of the said stacking technique is shown in FIG. 15b. The memory module balls 1504 must align to the pad interface 1505 on the controller module. As previously discussed in FIG. 11, fillers are used to physically connect two successively stacked modules. The controller balls 1506 will become the external interface to the main board. The final package is 4× bigger than the first high end option.

Figure 16:
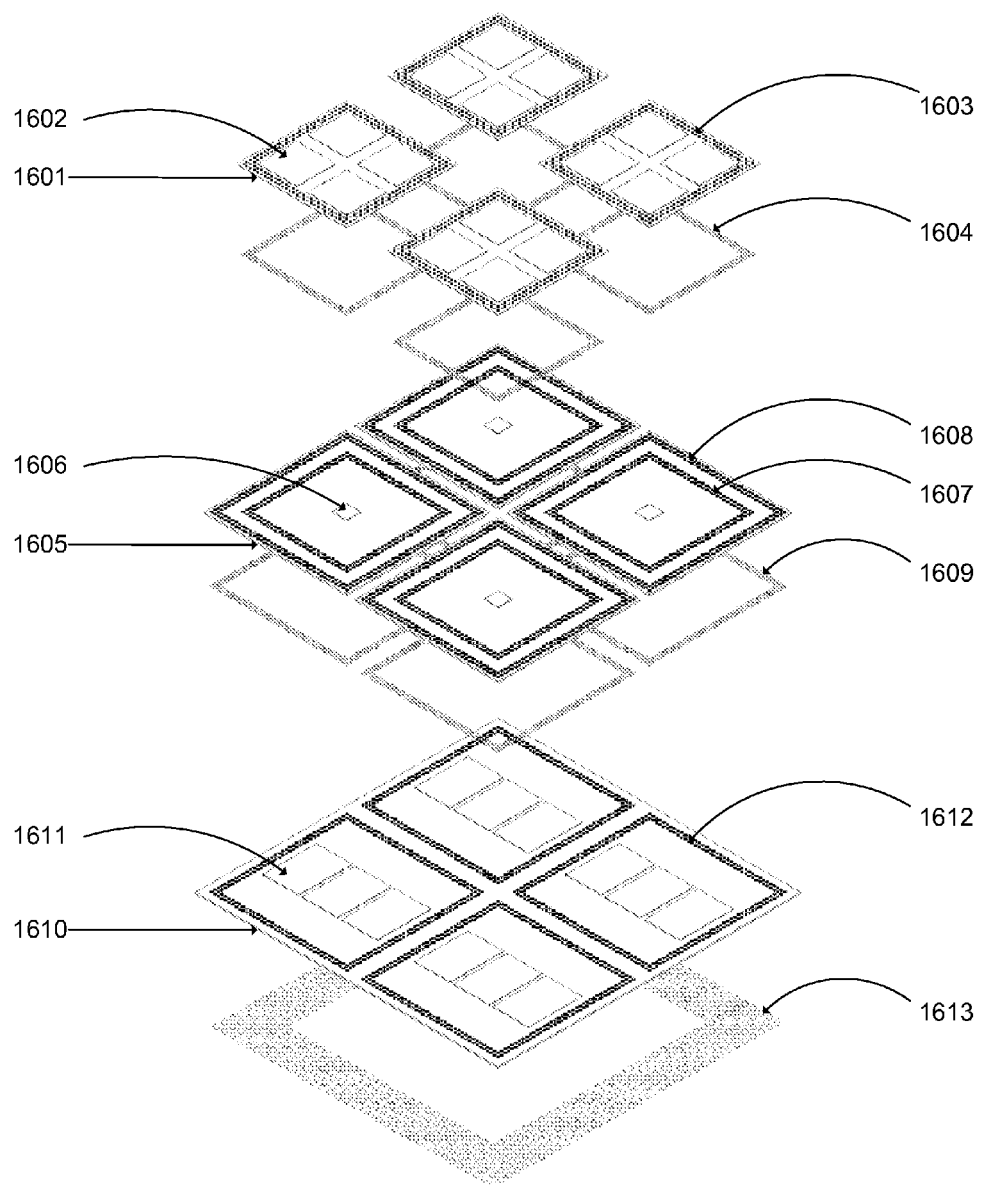
FIG. 16 is an isometric exploded version of the stacking technique presented in FIG. 14 according to an example embodiment of the present invention.
Figure 17A:
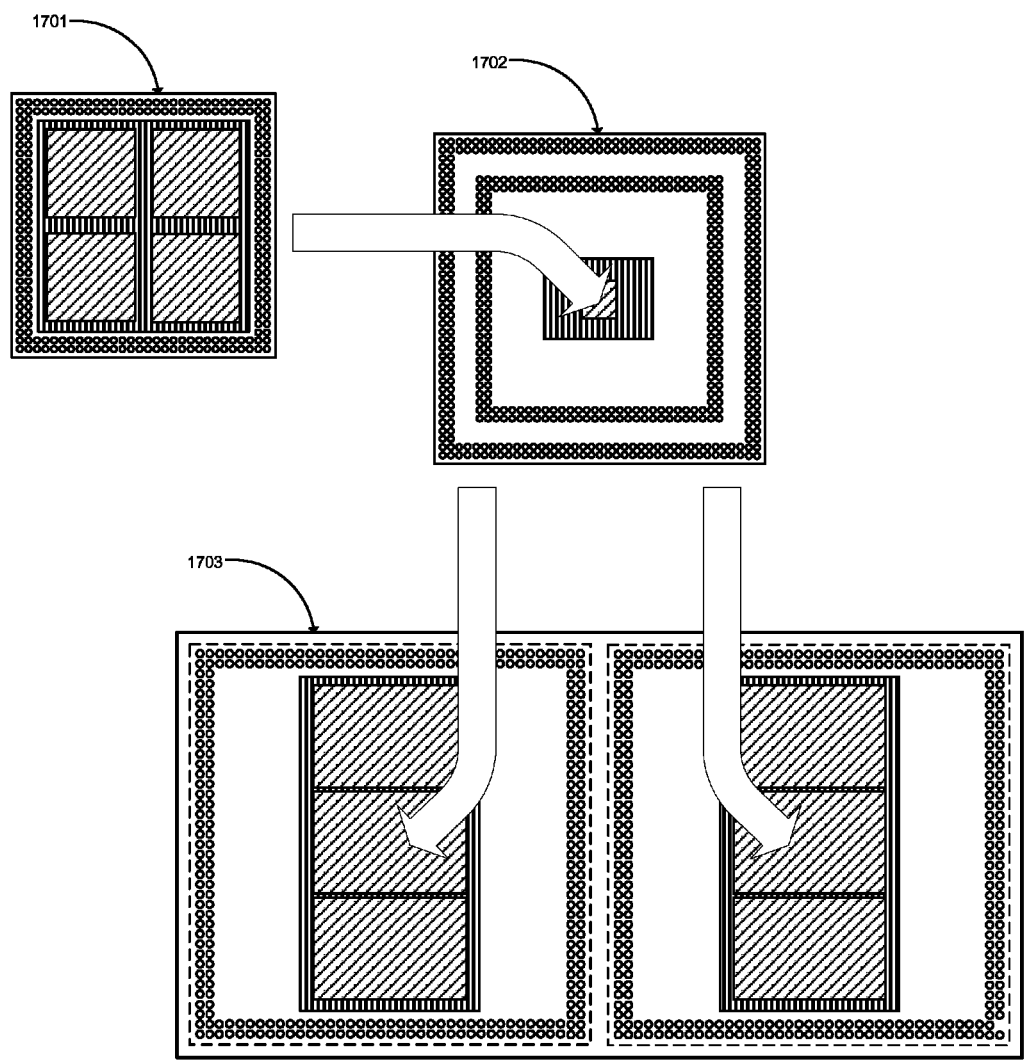
FIG. 17a, 17b depict the second low-end controller module configuration with stacked memory modules according to an example embodiment of the present invention. The figures also show how the balls have corresponding pads for inter-module connection.
Figure 17B:
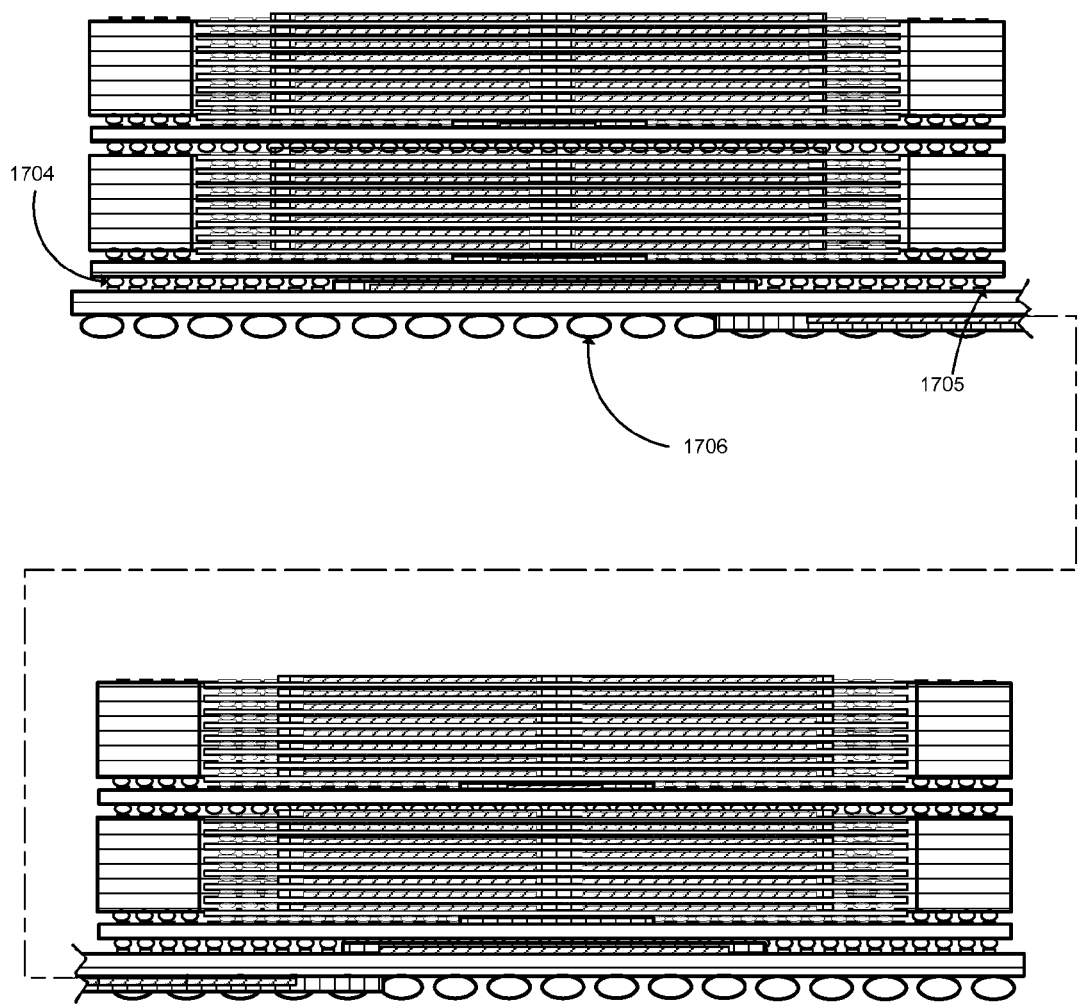

FIG. 16 shows the isometric and exploded drawing of the stacking technique discussed in FIG. 15. Pins are assigned strategically and modules stacked to make possible the maximum stacking and interconnection between modules. As previously discussed in FIG. 11, fillers are used to physically connect two stacked successively stacked modules.
1601—The Flash Module
1602—The Flash Dies
1603—The Flash Module Pads Interface to other Flash Modules
1604—The Flash Module Solder Balls
1605—The Memory Module
1606—The Flash Interface Controller Dies
1607—The Memory Module Pad Interface to Flash Modules
1608—The Memory Module Pad Interface to other Memory Modules
1609—The Memory Module Solder Balls
1610—The Controller Module
1611—The SDRAM Dies on top side and the FPROM and Main Controller-Processor at the bottom side
1612—The Controller Module Pads Interface to the Memory Modules
1613—The Controller Module Solder Balls FIG. 17a shows the stacking technique for the second low-end configuration. The stacked flash modules 1701 are further stacked on top of the memory modules 1702 which are then mounted on the controller module 1703 on two different locations. This technique can use both internal and external flash interface controller configurations, making this technique flexible. The cross-sectional view is shown in FIG. 17b. The memory module balls 1704 must align to the pad interface 1705 on the controller module. The controller balls 1706 will become the external interface to the main board. The final package is twice the size of the first high end option.

Figure 18:
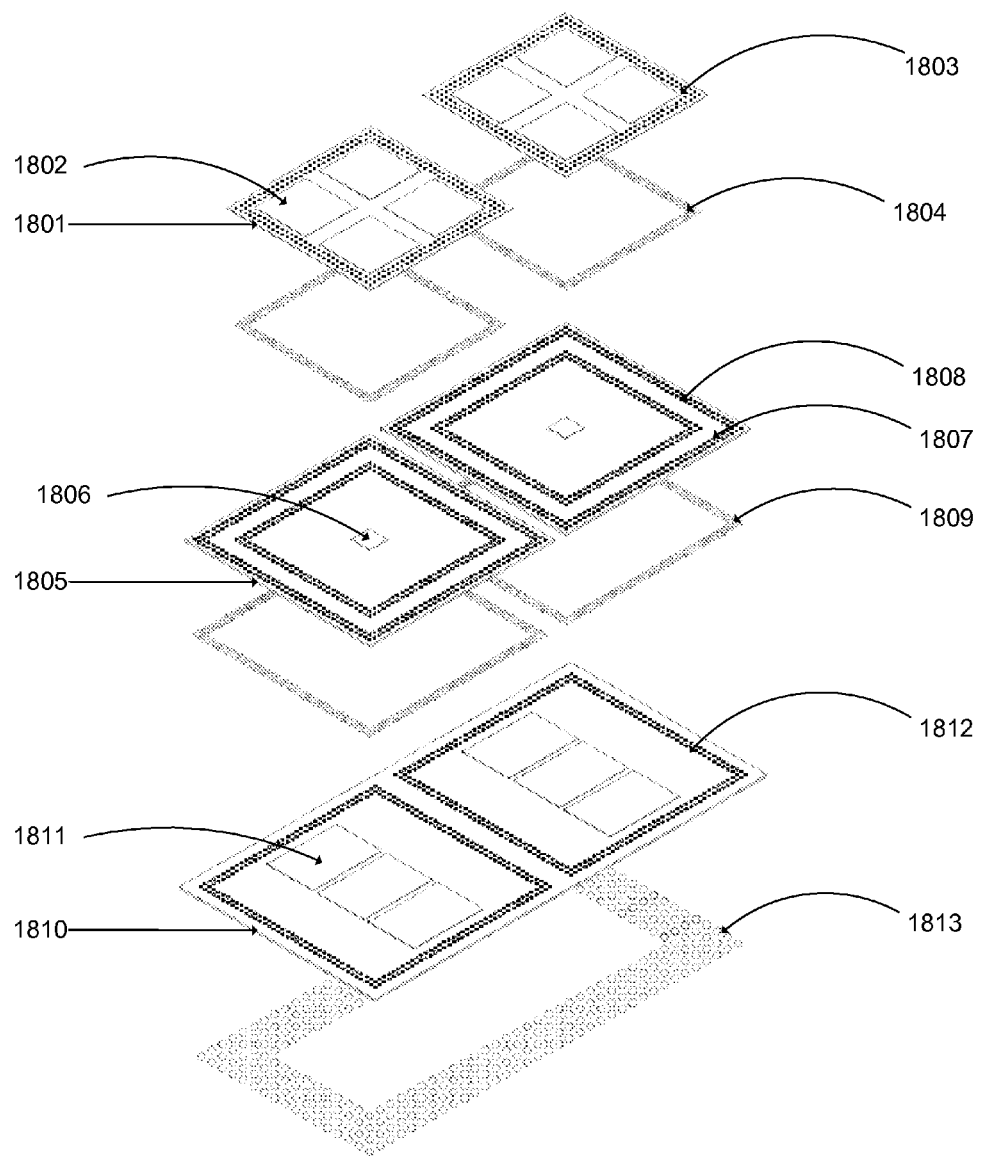
FIG. 18 is an isometric exploded version of the stacking technique presented in FIG. 17 according to an example embodiment of the present invention.

FIG. 18 shows the isometric and exploded drawing of the stacking technique discussed in FIG. 17. Pins are assigned strategically and modules stacked to make possible the maximum stacking and interconnection between modules. As previously discussed in FIG. 11, fillers are used to physically connect two stacked successively stacked modules.
1801—The Flash Module
1802—The Flash Dies
1803—The Flash Module Pads Interface to other Flash Modules
1804—The Flash Module Solder Balls
1805—The Memory Module
1806—The Flash Interface Controller Dies
1807—The Memory Module Pad Interface to Flash Modules
1808—The Memory Module Pad Interface to other Memory Modules
1809—The Memory Module Solder Balls
1810—The Controller Module
1811—The SDRAM Dies on top side and the FPROM and Main Controller-Processor at the bottom side
1812—The Controller Module Pads Interface to the Memory Modules
1813—The Controller Module Solder Balls A more detailed technique on how the pins are assigned and how modules are placed with different orientation in the stack is discussed in the following paragraphs.

Figure 19:
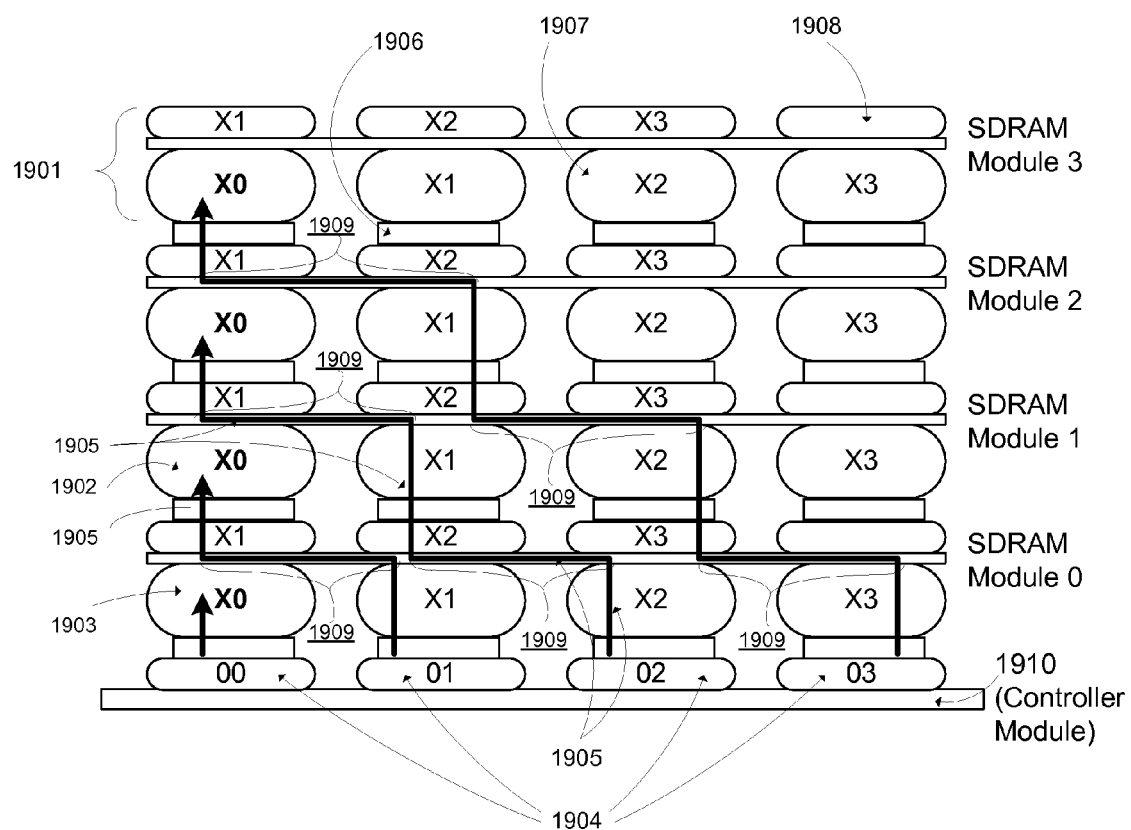
FIG. 19 shows a pin assignment and connection technique to be able to select specific layer in a multi-stacked module according to an example embodiment of the present invention.

FIG. 19 shows a first pin assignment and connection technique that enables a selection of specific module in a multiple module stack. The figure illustrates the controller and SDRAM modules as an example. The SDRAM module balls, such as 1907, are represented by big oblong shapes, and the pads such as 1908 are represented by smaller oblong shapes. A pad to ball connection is represented by a rectangle, such as 1906. The controller module has four active pads such as 1904, one each for the four SDRAM modules such as 1901. An active pad may be also referred to herein as an "active port". The controller module's active pad 00 1904 is ultimately connected to X0 ball 1903 of SDRAM module 0, active pad 01 is connected to X0 ball 1902 of SDRAM module 1, and so on. These X0 balls are the active balls for these SDRAM modules. Thus, as illustrated in FIG. 19, there is one active ball, such as X0, ultimately coupled to one active pad per module.

All SDRAM modules are identical, and in the example shown in FIG. 19, include the following connections as follows: an X1 passive ball is connected to an X1 passive pad, an X2 passive ball to X2 passive pad, and so on. The connection between a passive ball on one surface of a SDRAM module and a passive pad on another surface of the same SDRAM module, such as the X1 passive pad connection in FIG. 19, is named "passive port", such as passive ports 1909 illustrated in FIG. 19. The technique involves using a ladder-like routing path, such as 1905 on the stacked modules. This technique enables the controller module's active pad to be routed to the desired specific module in the stack. Thus, an active signal applied at an active pad, such as active pad 02, shown with reference number 1904 on controller module 1910, is routed through at least one passive port connecting a passive ball and passive pad, such as the passive ports 1905 connecting passive ball X2 to passive pad X2 and passive ball X1 to passive pad X2, respectively, so that this active signal eventually reaches an active ball, such as X0 ball SDRAM Module 2 in FIG. 19. The example embodiment illustrated in FIG. 19 comprises a repeating pattern for the balls and pads. Passive balls are connected within each module to passive pads with an offset distance equaling one periodic distance of the repeating pattern. For example in FIG. 19, an X1 passive ball is connected to an X1 passive pad, an X2 passive ball to an X2 passive pad, etc. By using repeating pattern and offsetting of the passive ball to passive pad within each module, other offset distances can be used in alternative embodiments of the present invention. For example, an alternative embodiment may include using an offset of two or any multiple of the periodic distance of the repeating pattern. This alternative embodiment is not intended to limit the scope of the present invention in any way.

Figure 20A:
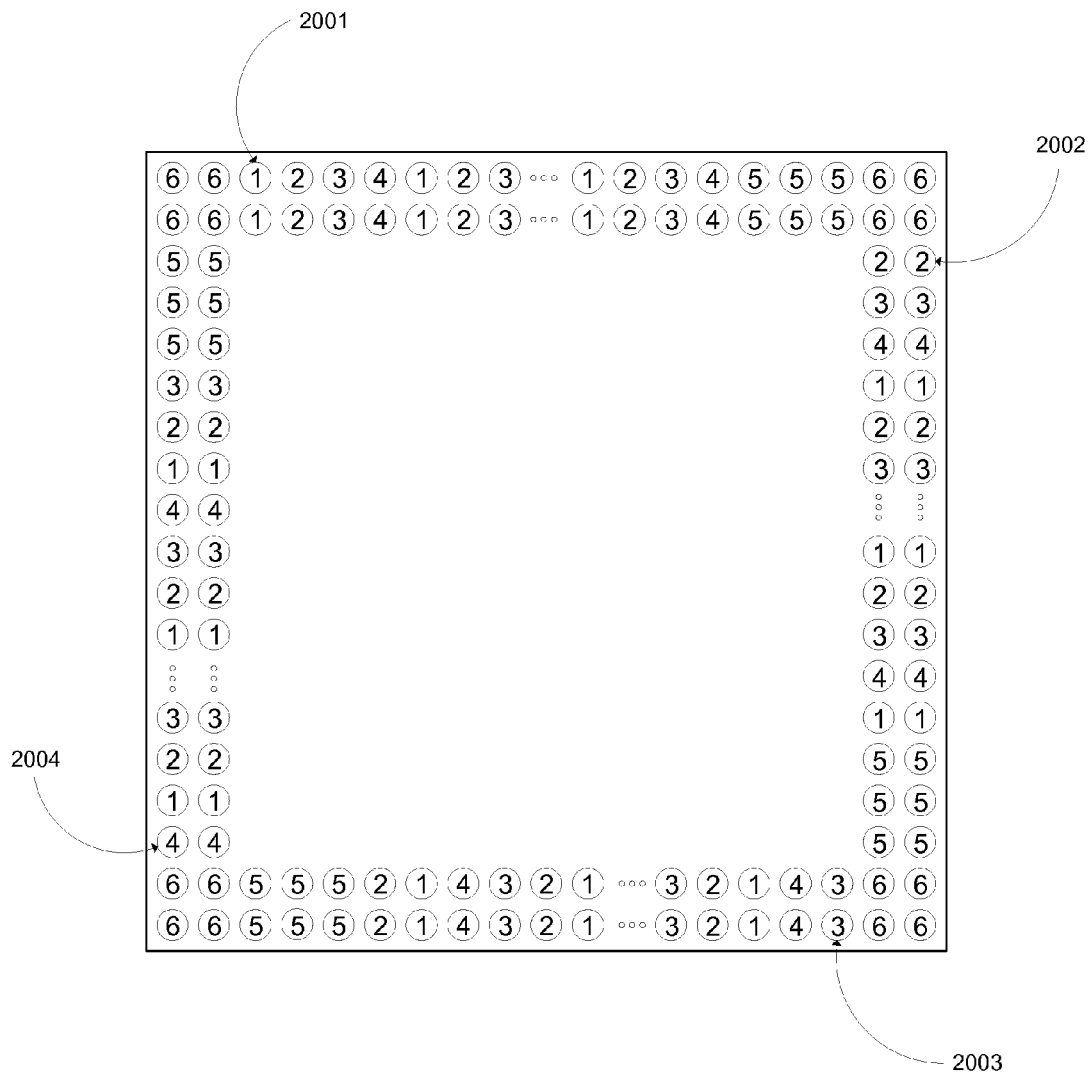
FIG. 20a shows another pin assignment technique which uses a rotational stacking orientation to allow stacking of four identical modules representing different bus interfaces according to an example embodiment of the present invention.
Figure 20B:
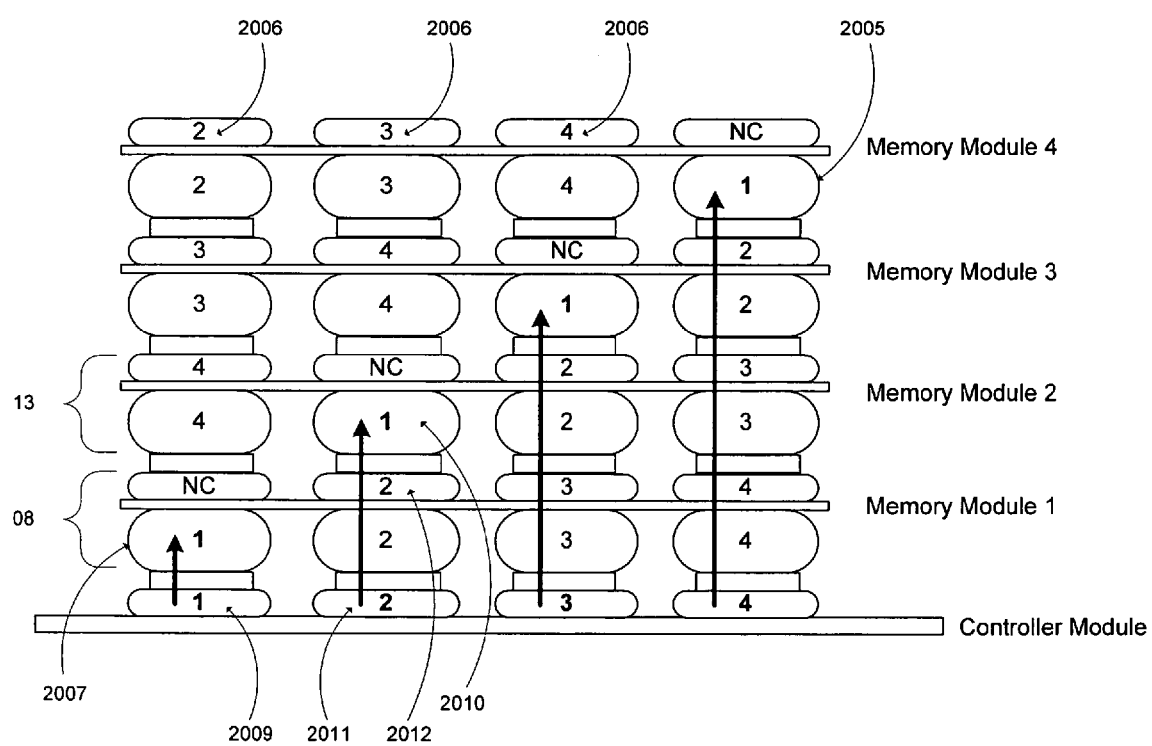
FIG. 20b shows a cross-section representation of the four stacked modules on a rotational stacking technique and how their pins mates according to an example embodiment of the present invention.
Figure 21A:
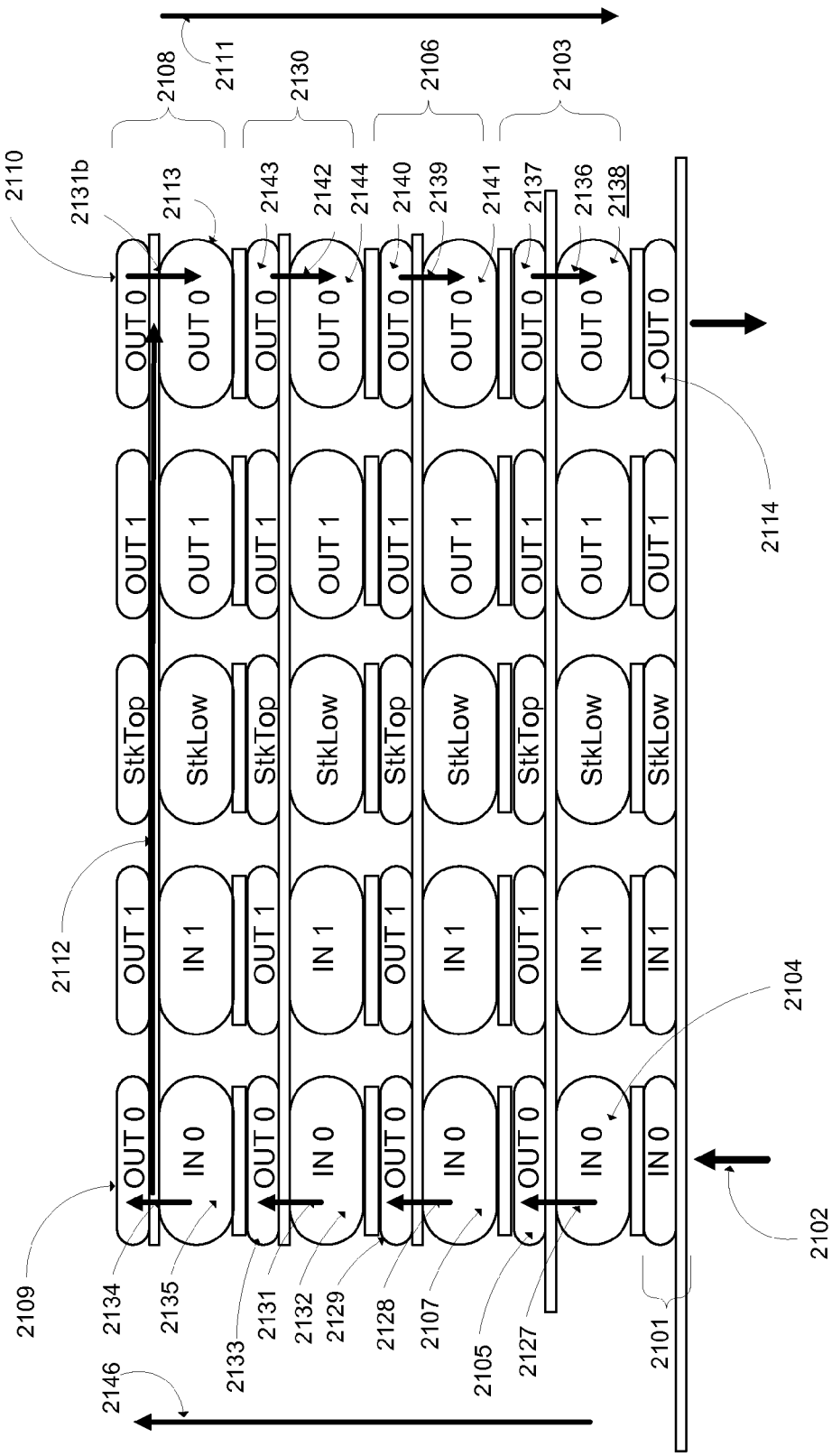
FIG. 21a shows another pin assignment and connection technique for creating a serial chain route from multiple modules in a stack by connecting a set of serial chain connections, according to another embodiment of the present invention.

Another pin assignment, connection, and stacking combo method introduced in this invention is the rotational stacking technique. FIG. 20*a* shows the pad interconnects for a certain base module and strategic numbering is assigned. Pads labeled with numbers 1 to 4 represent the four different groups of signals. Pads labeled with the number 5 are used for the vertical stacking IOs (additional details are illustrated in FIG. 21*a*). Pads labeled with the number 5 are used for the vertical stacking IOs (more details are illustrated in FIG. 21). Pads labeled with the number 6 are reserved for power and ground which are common to all modules in the stack. Since the stacked modules are identical, we can use rotational stacking to connect one module to one group of signals and the following rotated stacked module connects to another group of signals, and so on. This way ensures four identical modules to be stacked and connected to four different groups of signals from the base module which is typically a controller. Pad 1 2001, upon the substrate being rotated 90 degrees clockwise, occupies pad 2 2002 location relative to an un-rotated substrate such as the base substrate which is typically a controller. In a similar manner pad 1 2001 can be located at pad 3 2003 location, then pad 4 2004 location upon the substrate being rotated 180 and 270 degrees clockwise respectively. FIG. 20*b* shows a cross-sectional view of four such modules stacked over the base module. Memory and Controller modules are used as example. Pin 1s such as 2005 on the stacked modules are the only active signal pins for the module. The rest (numbered 2 to 4) 2006 are directly connected to the balls underneath them but have no other connections. This way connection is continued from bottom to top. The active pin 2007 of the first module 2008 is aligned to pin 1 pad 2009 on the base module and the second module's active pin 2010 is aligned on pin 2 2011 of the base module with second module being rotated 90 degrees clockwise. Since pin 2 2012 on the first module is directly connected to the ball underneath, this allows the pin 1 on the second module 2013 to be connected to pin 2 2011 of the base module. Rotating the next stacked module 90 degrees more will align it's active pin to the base module pin 3 and so on until the forth rotation.

The last connection technique is used for serial routing of all modules in the stack and allowing them to be externally accessible for horizontal expansion on a PCB. FIG. 21*a* shows how this technique is implemented in the stacking method. The main board 2101 contains the input signals 2102 which will then be connected to IN ball 2104 of the base module 2103. The modules, including base module 2103, stack modules 2106 and 2130, and an end module, such as top module 2108, each have a ball and pad that are coupled together by a serial chain circuit. For example, base module 2103 includes a serial chain circuit 2127 that couples IN ball 2104 with OUT pad 2105, and a serial chain circuit 2136 that couples OUT pad 2137 with OUT ball 2138; module 2106 includes a serial chain circuit 2128 that couples IN ball 2107 with OUT pad 2129, and a serial chain circuit 2139 that couples OUT pad 2140 with OUT ball 2141; module 2130 includes a serial chain circuit 2131 that couples IN ball 2132 with OUT pad 2133, and a serial chain circuit 2142 that couples OUT pad ball 2143 with OUT ball 2144; and top module 2108 includes a serial chain circuit 2134 that couples IN ball 2135 with OUT pad 2109 and a serial chain circuit 2145 that couples OUT pad 2110 with OUT ball 2113. Thus, the base module's OUT pad 2105 is connected to IN ball 2107 of the first stack module 2106, and so on.

A signal route that includes a serial chain circuit coupling a ball and pad is herein after referred to as a "serial chain connection", and at least two serial chain connections connected in series are herein after referred to as a "serial chain route", such as serial chain route 2146 or 2111. The top module 2108 terminates the signal to the top pad 2109 and routes, with connection 2112, the signal internally to another pad, such as OUT pad 2110, which is connected directly to the ball underneath, such as OUT ball 2113. Since the modules are identical, this routed signal passes through another set of serial chain connections that comprise another serial chain route, such as serial chain route 2111 for the stack until it reaches OUT pad 2114 of the main board for external access. A serial chain connection includes a serial chain input and a serial chain output. A serial chain input is disposed to receive a signal, while a serial chain output is disposed to provide the signal. For example in FIG. 21*a*, IN balls 2104, 2107, 2132, and 2135, and OUT pads 2110, 2143, and 2140 are serial chain inputs, respectively. OUT pads 2105, 2129, 2133, and 2109, and OUT balls 2113, 2144, 2141, and 2138 are serial chain outputs, respectively. At least one of the balls and pads that are coupled to their respective chain circuit may be in the form of a passive ball and passive pad, respectively, since an active signal, such as signal 2102, applied at active pad 2101, can be routed through a series of serial chain circuits that couple respective balls and pads. In effect, each of these serial chain circuits functions as a passive port. A serial chain circuit, however, can also terminate a serial chain route, such as serial chain route 2146, and branching or routing this serial chain route to another pad that functions as a serial chain input of another serial chain route, such as serial chain route 2111, as described further below.

Figure 21B:
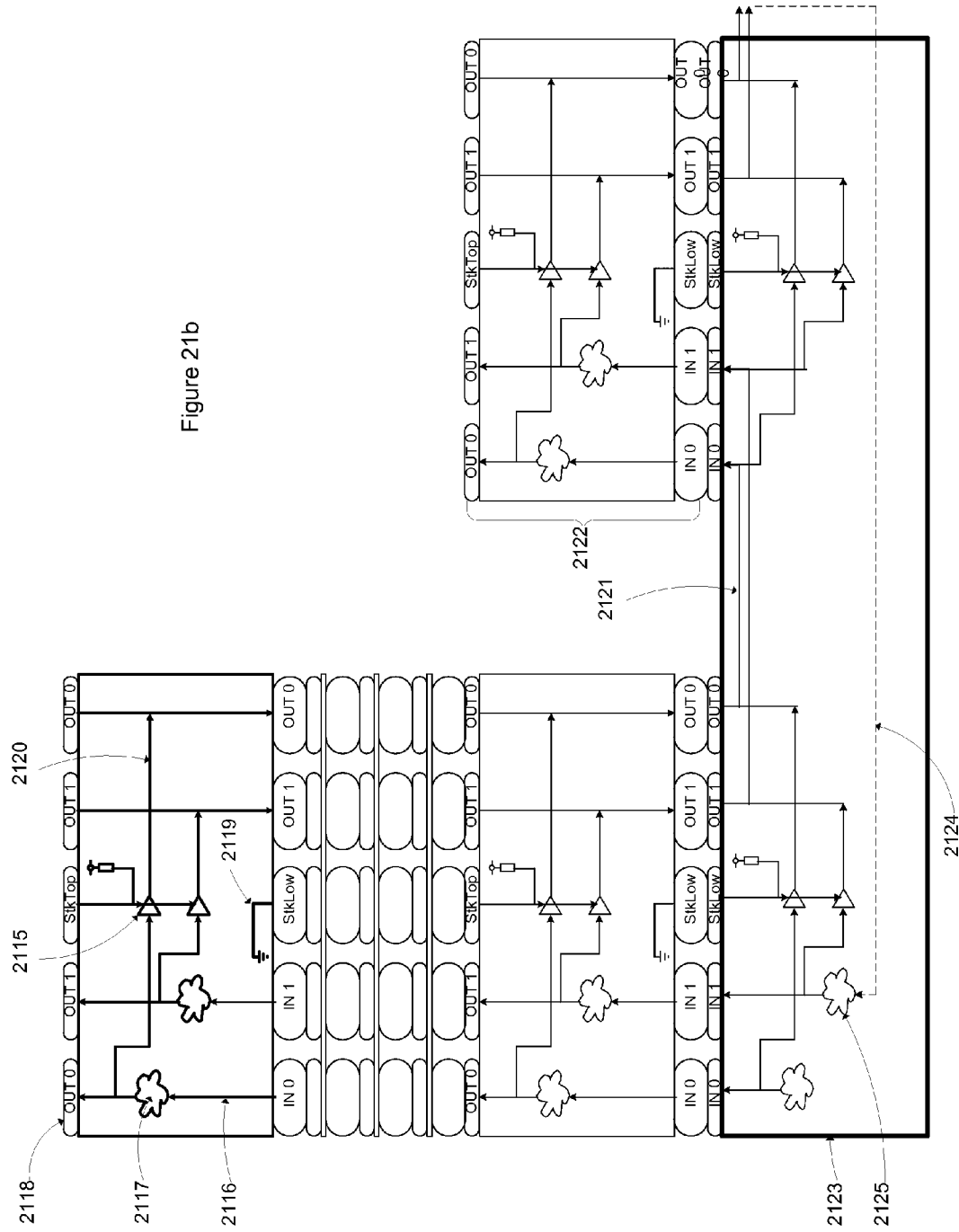
FIG. 21b shows how a serial chain connection is routed from one stack location to another allowing application of both vertical and horizontal expansion independently or simultaneously according to an example embodiment of the present invention.

FIG. 21b illustrates the termination and branching of a serial chain to other pads on top module 2108. All modules have a control circuit that includes a selectable buffer 2115 that tri-states the input when pulled low. The signal from the IN balls 2116 enters the internal circuit 2117 and exits the circuit connecting to the OUT pad 2118. The buffer's 2115 control line is weakly pulled up internally. The "StkLow" ball is connected internally to GND 2119, thus pulling down the buffer control line when a module is stacked above it, and it is pulled up when no module is stacked directly above it. When the buffer is pulled high, it will let the input signal branch out 2120 to the other pads, thus making possible the trace to loop back to the solder balls of the base module. When a module is stacked above a module, the buffer control signal is pulled low, tri-stating the input signal disallowing the branching effect. This technique allows the signal to be accessible to the external balls of the base module, thus horizontal expansion for serial signal is achievable. The balls are then routed, with connection 2121, to the other modules 2122 on the other locations. The same technique is used on the main board 2123. When a package is not detected on the "StkLow" pad, the buffer allows the input to connect to the designated pads on the other locations. The tri-stated buffer technique is redundant to all locations. An example is the JTAG TDI-TDO signal. The driver circuit 2125 sends out TDI signals to the pads, and the closing TDO signal 2124 loops back to the driver circuit.

Combining these stacking, pin assigning and connection techniques allow interconnection between modules with both parallel and series signals to both vertical and horizontal expansion. The technique is very flexible depending on the specific application, capacity, board size and height limit.

We claim:

1. A method for stacking a plurality of modules, said plurality of modules including a first memory module and a second memory module; said first memory module having a first surface and a second surface; said second memory module having a third surface and a fourth surface; said method comprising:
  providing a first set of connections on said first memory module by:
    forming a first active ball on said first surface,
    forming a first set of passive balls on said first surface, said first set of passive balls including a first passive ball and a second passive ball, and
    forming a first set of passive pads on said second surface, said first set of passive pads including a first passive pad and a second passive pad; providing a second set of connections on said second memory module by:
    forming a second active ball on said third surface, and
    forming a third passive ball on said third surface, a third passive pad on said fourth surface;
  connecting said first passive ball to said first passive pad, connecting said second passive ball to said second passive pad, and connecting said third passive ball to said third passive pad;
  coupling said first passive pad to said second active ball by stacking said first memory module to said second memory module;
  forming a first serial chain route that includes at least one serial chain connection, said serial chain connection including: a serial chain circuit, a serial chain input, and serial chain output;
  coupling said serial chain input with said serial chain output through said serial chain circuit;
  forming a second serial chain route;
  forming a control circuit for enabling a routing path that connects said first serial chain route with said second serial chain route within an end module; and
  said control circuit is disposed to enable said routing path in response to a control input signal received from another module from the plurality of modules when said end module is coupled to said another module.

2. The method of claim 1, wherein:
  said providing a first set of connections on said first memory module further includes placing said first passive ball at an offset distance from said first passive pad, and placing said second passive ball at said offset distance from said second passive pad; and
  said providing a second set of connections on said second memory module further includes placing said third passive ball at said offset distance from said third passive pad.

3. The method of claim 2, wherein the plurality of modules includes a controller module that is disposed with an active pad; and providing a ladder-like routing path from said active pad to said second active ball by causing said active pad connect with said first passive ball by stacking said controller module to said first memory module.

4. The method of claim 2:
  wherein the plurality of modules includes a controller module that is disposed with an active pad;
  wherein said providing a first set of connections on said first memory module further includes placing said first passive ball at a location that is opposite from said first passive pad, and placing said second passive ball at a location that is opposite from said second passive pad;
  wherein said providing a second set of connections on said second memory module further includes placing said third passive ball at a location opposite from said third passive pad; and
  further comprising: providing a rotational routing path from said active pad to said second active ball by causing said active pad to connect with said first passive ball by stacking said controller module to said first memory module.

5. The method of claim 1, further comprising: using a selectable buffer that extends a routing path of said first serial chain route within the first memory module.

6. The method of claim 1, further comprising the step of providing a selectable buffer disposed to create a routing path that includes said first serial chain route within the first memory module and said second serial chain route.

7. The method of claim 1, further comprising: coupling a controller module to the first memory module.

8. The method of claim 1, further including:
  using said first active ball as said first serial chain input and said first passive pad as said first serial chain output.

9. The method of claim 1, further comprising:
  using said second active ball as said second serial chain input and said third passive pad as said second serial chain output;

disposing said second memory module with a selectable buffer that, if said second memory module does not have a third memory module from the plurality of module stacked on top of said second memory module, causes a signal traveling through said serial chain route to terminate at said third passive pad, and to route said signal to a third serial chain circuit.

10. The method of claim 9, further including:
coupling a main board to the plurality of modules, said main board having at least one active pad coupled to said serial chain route.

11. The method of claim 1, further including:
using the first module as said another module; and
using the second module as said end module.

12. A method for stacking a plurality of modules, said plurality of modules including a first memory module and a second memory module; said first memory module having a first surface and a second surface; said second memory module having a third surface and a fourth surface; said method comprising:
forming one or more active ports on the first and second memory modules, said one or more active ports for carrying one or more active signals;
forming one or more passive ports on the first and second memory modules, said one or more passive ports for passing through said one or more active signals on the first and second memory modules;
coupling one of said active ports formed on said first memory module to one of said passive ports formed on said second memory module by stacking said first memory module to said second memory module;
forming a first serial chain route that includes at least one serial chain connection, said serial chain connection including: a serial chain circuit, a serial chain input, and serial chain output;
coupling said serial chain input with said serial chain output through said serial chain circuit;
forming a second serial chain route;
forming a control circuit for enabling a routing path that connects said first serial chain route with said second serial chain route within an end module; and
said control circuit is disposed to enable said routing path in response to a control input signal received from another module from the plurality of modules when said end module is coupled to said another module.

13. The method of claim 12, further comprising: using a selectable buffer that extends a routing path of said first serial chain route within the first memory module.

14. The method of claim 12, further comprising the step of providing a selectable buffer disposed to create a routing path that includes said first serial chain route within the first memory module and that further includes said second serial chain route.

15. The method of claim 12, further comprising: coupling a controller module to the first memory module and using said second memory module as said end module.

16. The method of claim 12, further comprising: adding to the plurality of modules a controller module that is disposed with an active pad; and providing a ladder-like routing path that includes a connection between said active pad from said controller module and one of said passive ports by stacking said first memory module with said controller module.

* * * * *